(12) United States Patent
Fukunaga et al.

(10) Patent No.: US 6,296,505 B1
(45) Date of Patent: Oct. 2, 2001

(54) SOCKET FOR ELECTRICAL PARTS

(75) Inventors: Masami Fukunaga; Hideo Shimada; Yoshiyuki Ohhashi, all of Kawaguchi (JP)

(73) Assignee: Enplas Corporation, Saitama-ken (JP)

( * ) Notice: Subject to any disclaimer, the term of this patent is extended or adjusted under 35 U.S.C. 154(b) by 0 days.

(21) Appl. No.: 09/345,108

(22) Filed: Jun. 29, 1999

(30) Foreign Application Priority Data

| Jun. 30, 1998 | (JP) | 10-199837 |
| May 21, 1999 | (JP) | 11-141048 |
| May 28, 1999 | (JP) | 11-150195 |

(51) Int. Cl.[7] .................................................. H01R 11/22
(52) U.S. Cl. ......................................... 439/268; 439/331
(58) Field of Search .................................. 439/263, 264, 439/268, 330, 331

(56) References Cited

U.S. PATENT DOCUMENTS

| Re. 36,217 | * | 6/1999 | Petersen | 324/755 |
| 4,808,119 | * | 2/1989 | Pfaff | 439/268 |
| 5,254,012 | | 10/1993 | Wang . | |
| 5,342,213 | | 8/1994 | Kobayashi . | |
| 6,027,355 | * | 2/2000 | Ikeya | 439/268 |

FOREIGN PATENT DOCUMENTS

| 5-249974 | 9/1993 | (JP) . |
| 8-236233 | 9/1996 | (JP) . |

* cited by examiner

*Primary Examiner*—Khiem Nguyen
(74) *Attorney, Agent, or Firm*—Fish & Richardson P.C.

(57) ABSTRACT

A socket for an electrical part comprises a socket body having a mount portion on which an electrical part having terminals is mounted, a number of contact pins to be contacted to or separated from the terminals of the electrical part and a movable plate disposed to the socket body to be movable perpendicularly with respect to the mount portion in a usable state of the socket. Each of the contact pins has a pair of elastic pieces formed, at front end portions thereof, with contact portions which are opened or closed in accordance with the movement of the movable plate thereby to establish an electrical connection between the contact portions and the terminals of the electrical part when the contact portions are closed. The movable plate is provided with cam portions arranged between adjacent contact pins, respectively, and when the movable plate is moved, the elastic pieces are pressed by a pair of cam portions disposed on both the sides of each of the contact pins thereby to open the contact portions.

22 Claims, 40 Drawing Sheets

SOCKET FOR ELECTRICAL PARTS

BACKGROUND OF THE INVENTION

The present invention relates to a socket for electrical parts for detachably holding an electrical part such as semiconductor device (called as "IC package" hereinlater).

In a known art, as "socket for electrical parts" in this kind, there is provided an IC socket for detachably holding an IC package as "electrical part" such as disclosed in Japanese Utility Model Publication No. HEI 6-44050.

One known example of an IC socket of this kind is shown in FIGS. 35A and 35B. The shown IC socket is provided with a contact pin 1 to which a pair of clamping pieces 1a are formed. The clamping pieces 1a are each formed with a contact portion 1b contacting to or separating from a connection pin P of an IC package, not shown, and also formed with a press portion 1c which is pressed by a cam portion 3a of a movable plate 3.

The cam portion 3a is inserted into a space between a pair of press portions 1c, and as shown in FIG. 35A, when the movable plate 3 is depressed, the paired press portions 1c are depressed and widened. Under this state, the connection pin P is inserted into the contact portions 1b through an insertion hole 4a formed to a cover 4.

Next, as shown in FIG. 35B, when the movable plate 3 is raised upward, the cam portion 3a is moved upward, and the connection pin P is clamped by and between the paired contact portions 1b thereby to establish an electrical connection therebetween.

According to the structure mentioned above, the IC package can be mounted or dismounted, without giving no specific insertion or withdrawal force, only by moving upward or downward the movable plate 3, thus improving a working efficiency.

However, in such structure of the conventional IC socket, a pair of contact portions 1b are depressed and widened by inserting the cam portion 3a between a pair of press portions 1c of each of the contact pins 1, and accordingly, it is necessary to insert the cam portion 3a into the paired press portions 1c at the time of arranging the contact pin 1 and the movable plate 3, which results in an adverse workability at an assembling time, and it is also disadvantageous to arrange the contact pins 1 with narrow pitch.

Furthermore, in the prior art mentioned above, the connection pin P of the IC package is held between the contact portions 1b of the paired clamping pieces 1a to achieve an electrical connection. However, because this clamping structure does not attain a wiping effect, it is difficult to realize a stable electrical contacting condition.

In the known art, there is also provided an IC socket of the kind mentioned above such as disclosed in Japanese Patent Publication No. HEI 3-66787 showing an IC package as "electrical part", in which a number of IC leads are formed so as to project downward from a lower surface of the IC package, and these IC leads are arranged in grid shape having vertical (Y-axis direction) and horizontal (X-axis direction) rows.

An IC socket, as "socket for electrical parts", achieving the electrical connection by holding such IC package has an outer rectangular peripheral portion formed of an insulation material and has a substrate on which a cover member is applied to be horizontally movable.

This cover member is formed with a number of IC lead insertion holes having an arrangement corresponding to the grid shaped IC lead arrangement so that the arrangement of the IC lead insertion holes provides a parallelogram shape, and the vertical rows (Y) and horizontal rows (X) of the IC leads are inclined at angles of 45° with respect to the respective side lines of the rectangular outer shape of the cover member. Furthermore, the substrate of the IC socket is formed with a number of contact members having an arrangement corresponding to the arrangements of the IC leads and the IC lead insertion holes.

In such structure, when the cover member is moved in one diagonal direction of the IC lead grid arrangement, the IC package mounted to the cover member is also moved and, hence, the IC leads are separated from or contacted to the contact members.

However, in such conventional structure, in order to ensure displacement or shift amount of the contact member with respect to the IC lead, the arrangement of the IC lead insertion holes is inclined at angles of 45° with respect to the rectangular outer shape of the cover member. Accordingly, the cover member, and hence, an entire structure of the IC socket device has been made large, thus being disadvantageous and providing a problem.

SUMMARY OF THE INVENTION

A primary object of the present invention is to substantially eliminate defects or drawbacks encountered in the prior art mentioned above and to provide a socket for electrical parts having a structure capable of improving a assembling workability of structural elements or members and being advantageous for narrow pitch arrangement of contact pins.

Another object of the present invention is to provide a socket for electrical parts capable of achieving an improved wiping effect at a time of contacting a contact pin to a terminal and achieving an improved contacting stability.

A further object of the present invention is to provide a socket for electrical parts capable of making compact an entire structure thereof while ensuring a displacement amount of contact pins.

These and other objects can be achieved according to the present invention by providing, in one aspect, a socket for an electrical part comprising:

a socket body having a mount portion on which an electrical part having terminals is mounted;

a number of contact pins to be contacted to or separated from the terminals of the electrical part; and a movable plate disposed to the socket body to be movable perpendicularly with respect to the mount portion in a usable state of the socket, wherein each of the contact pins has a pair of elastic pieces formed, at front end portions thereof, with contact portions which are opened or closed in accordance with the movement of the movable plate thereby to establish an electrical connection between the contact portions and the terminals of the electrical part when the contact portions are closed, the movable plate is provided with cam portions arranged between adjacent contact pins, respectively, and when the movable plate is moved, the elastic pieces are pressed by a pair of cam portions disposed on both the sides of each of the contact pins thereby to open the contact portions.

In a preferred embodiment of this aspect, the paired elastic pieces of the contact pin are formed with bent portions, respectively, in a manner that the bent shapes of both the bent portions are opposed and cross to each other and the bent portions are pressed by the cam portion of the movable plate thereby to open the contact portions of the elastic pieces of the contact pin.

The elastic pieces of both the adjacent contact pins are pressed by one cam portion of the movable plate disposed between the elastic pieces of the adjacent contact pins. The paired elastic pieces of the contact pin has a common base portion and the elastic pieces are opposed to each other by bending the base portion.

The contact pin is provided with a solder tail portion extending from the base portion of the elastic pieces in a direction opposing to the elastic pieces, the solder tail portion is formed with a bent portion near the base portion of the elastic pieces so that a center line of the paired elastic pieces accords with a center line of the solder tail portion.

The contact pins are arranged in matrix shape in a manner that the paired contact portions of the respective contact pins have displaced direction having predetermined angles, preferably of 45°, with respect to an arrangement direction of the contact pins.

Each of the terminal of the electrical part has a spherical outer shape and the paired contact portions of the contact pin are positioned on a diametral line of the spherical terminal on both sides thereof.

Each of the terminal of the electrical part has a spherical outer shape and the paired contact portions of the contact pin are displaced and have surfaces contacting the terminal, the contacting surfaces being inclined with respect to a displaced direction of the contact portions.

The spherical terminal is a solder ball.

An axis passing a root portion of at least one of the elastic pieces and an axis passing the contact portion thereof are offset from each other so that the contact portions slide on a surface of the terminal after contacting thereto by an elastic force of the elastic pieces.

According to the above one aspect, the cam portion of the movable plate for opening or closing the contact portions of the contact pin is not inserted into the space between both the paired contact portions and disposed between the adjacent contact pins, so that when the movable plate is arranged it is not necessary to insert the cam portion of the movable plate into the closed paired contact portions, thus improving the assembling workability.

Furthermore, since the paired elastic pieces cross each other, if a distance from the one elastic piece of the adjacent contact pin be ensured, there is no problem regarding a distance from the other one elastic piece, thus arranging the contact pins with narrow pitch. Further, the contact pin is formed with the <-shaped bent portions and the elastic piece is not formed with a partially large portion and has substantially entirely the same width, so that stress is not concentrated to a specific portion and equally dispersed, thus improving the flexibility of the elastic pieces.

Still furthermore, since the elastic pieces of both the adjacent contact pins are pressed and flexed by only one cam portion of the movable plate, the structure can be made compact. Moreover, since the base portion of the paired elastic pieces is bent so that these elastic pieces are opposed to each other, the contact pin can be easily manufactured through a press working of one plate member.

Still furthermore, since the solder tail portion is bent at a portion near the base portion so that the center line of the paired elastic pieces accords with the center line of the solder tail portion, when the IC package is conveyed by the automatic machine, for example, the IC package can be preferably set to a plurality of IC sockets mounted on the printed circuit board.

Still furthermore, the contact pins can be arranged in matrix shape in a manner that the paired contact portions of each of the contact pins have a displaced direction having certain angles with respect to the contact pin arranging direction, so that the contact pins can be arranged with small or narrow pitch.

Still furthermore, since the paired contact pins are opposed to each other on both the sides of the spherical terminal on the diametral line thereof to be perpendicular thereto, the edges of the contact portions never contact the spherical terminal, thus preventing the edges from being damaged.

In the preferred modification, since the paired contact portions have contacting surfaces to the spherical terminal, which are inclined with respect to the displaced direction of the contact portions, when the contact portions clamp the terminal, the contact portions slide on the surface of the terminal and an oxide film on the surface of the terminal can be broken thereby to achieve a stable electrical connection.

In another aspect of the present invention, there is provided a socket for an electrical part comprising:

a socket body having a mount portion on which an electrical part having terminals is mounted; and a number of contact pins capable of being contacted to or separated from the terminals of the electrical part, wherein each of the contact pins has an elastic piece having, at a front end portion thereof, with a contact portion which is contacted to or separated from each of the terminals of the electrical part and wherein an axis passing a root portion of the elastic piece and an axis passing the contact portion are offset from each other so that the contact portion slides on a surface of the terminal after contacting thereto by an elastic force of the elastic piece.

In this aspect, the contact portion of the contact pin has a flat contact surface contacting to the terminal, the flat contact surface has predetermined angles with respect to a direction normal to a contacting or separating direction of the contact portion.

In a further aspect of the present invention, there is provided a socket for an electrical part comprising:

a socket body having a mount portion on which an electrical part having terminals is mounted; and a number of contact pins capable of being contacted to or separated from the terminals of the electrical part, wherein each of the contact pins has a pair of elastic pieces having, at front end portions thereof, with contact portions which are contacted to or separated from each of the terminals of the electrical part and wherein an axis passing a root portion of at least one of the elastic pieces and an axis passing the contact portion thereof are offset from each other so that the contact portions slide on a surface of the terminal after contacting thereto by an elastic force of the elastic pieces.

In this aspect, each of the contact portions of the contact pin has a flat contact surface contacting to the terminal, and the flat contact surface has predetermined angles with respect to a direction normal to a contacting or separating direction of the contact portion.

In a still further aspect of the present invention there is provided a socket for an electrical part comprising:

a socket body having a mount portion on which an electrical part having terminals is mounted;

a number of contact pins capable of being contacted to or separated from the terminals of the electrical part; and a movable plate disposed to the socket body to be movable perpendicularly with respect to the mount portion in a usable state of the socket, wherein each of the contact pins has a pair of elastic pieces formed at front end portions thereof with contact portions which are opened or closed in accordance with the movement of the movable plate thereby to establish an electrical connection between the contact portions and the terminals of the electrical part when the contact portions are closed, the movable plate is provided with cam portions each arranged between adjacent contact pins, respectively, and when the movable plate is moved, the elastic pieces are pressed by a pair of cam portions disposed on both the sides of each of the contact pins thereby to open the contact portions, and wherein an axis passing a root portion of at least one of the elastic pieces and an axis passing the contact portion thereof are offset from each other so that the contact portions slide on a surface of the terminal after contacting thereto by an elastic force of the elastic pieces.

According to these above aspects, the contact portions of the contact pin are formed with flat surface portions contacting the terminal, which has a predetermined angles with respect to the direction normal to the direction contacting to or separating from the terminal, thus achieving move improved wiping effect.

Furthermore, in the arrangement in which the axis passing the root portion of the elastic piece and the axis passing the contact portion are offset from each other, the contact portions further slide after contacting to the terminal by the elastic force of the elastic piece, so that the further improved wiping effect can be achieved with small change of structure, and the electrically stable contacting condition can be further improved.

In a still further aspect of the present invention, there is provided a socket for an electrical part comprising:

a socket body having a mount portion on which an electrical part having terminals is mounted; and a number of contact pins capable of being contacted to or separated from the terminals of the electrical part, wherein the contact pins are arranged in shape of matrix having vertical and horizontal rows, the matrix arrangement having a rectangular outer edge portion and the socket for an electrical part having a rectangular outer shape in a plan view in a usable state, respective side portions of the rectangular outer edge portion of the matrix arrangement and respective side portions of the rectangular outer shape of the socket are substantially parallel to each other, and wherein each of the contact pins is formed with an elastic piece having, at a front end portion thereof, a contact portion contacting to or separating from the terminal of the electrical part and the contact portions of the elastic pieces of the respective contact pins have a displaced direction which has predetermined angles, preferably of 45°, with respect to the arrangement direction of the vertical and horizontal rows of the contact pins in the matrix arrangement thereof.

In a preferred embodiment of this aspect, a pair of elastic pieces are formed to each of the contact pins and the elastic pieces having, at front end portions thereof, a pair of contact portions between which the terminal of the electrical part is clamped to establish an electrical connection therebetween.

The socket for an electrical part of this aspect may further comprise a movable plate disposed to the socket body to be movable perpendicularly with respect to the mount portion in a usable state of the socket, the movable plate being provided with a cam portion. The elastic piece is formed at a front end portion thereof with a contact portion which is displaced by pressing the elastic piece by the cam portion of the movable plate when the movable plate is moved perpendicularly.

According to this aspect, the contact pins are arranged in shape of matrix having a rectangular outer edge portion and the socket for an electrical part has a rectangular outer shape in a plan view in a usable state in a manner that the respective side portions of the rectangular outer edge portion of the matrix arrangement and the respective side portions of the rectangular outer shape of the socket are substantially parallel to each other, and the displaced direction of the contact portions has predetermined angles, preferably of 45°, with respect to the arrangement direction of the vertical and horizontal rows of the contact pins in the matrix arrangement thereof. Accordingly, the displacement amount of the contact portions can be ensured and, in addition, the outer shape of the socket for the electrical part can be also made small.

In the preferred embodiment, since the terminal such as solder ball as electrical part is clamped by displacing the paired contact portions of the elastic pieces from each other, the displacing amount of each contact portion can be made small in comparison with a case that only one contact portion is displaced, thus making also small the moving amount of the movable plate which displaces the contact pins. In this point, according to the present invention, in addition to the above effects, the socket for an electrical part can be made compact.

Furthermore, the movable plate is disposed to be movable in the perpendicular direction with respect to the mount portion of the socket body, and when the movable plate is moved in this direction, the elastic pieces are pressed by the cam portions formed to the movable plate so that the contact portions of the contact pins are contacted to or separated from the terminals of the electrical parts. Accordingly, the horizontal width of the socket can be also made compact in comparison with the structure in which the movable plate is moved horizontally to displace the contact portions, thus being advantageous.

Further, the nature and characteristic features of the present invention will be made more clear from the following descriptions made with reference to the accompanying drawings.

BRIEF DESCRIPTION OF THE DRAWINGS

In the accompanying drawings:

FIG. 7 includes sectional views showing a function of the first embodiment, in which

FIG. 8 includes plan views of the paired contact portions of the contact pin for showing a function of the first embodiment, in which

FIG. 9 includes sectional views of a latch in the first embodiment for showing movement thereof, in which

FIG. 12 shows a contact pin representing a third embodiment of the present invention, in which

FIG. 14 includes plan views of the paired contact portions of the contact pin for showing a function of the third embodiment, in which

FIG. 15 represents a contact pin according to a fourth embodiment of the present invention showing a state that a solder ball is clamped by a pair of contact portions of the contact pin, in which

FIG. 16 shows a contact pin representing a fifth embodiment of the present invention, in which

FIG. 18 shows a contact pin representing a seventh embodiment of the present invention, in which

FIG. 22 includes sectional views according to the seventh embodiment, in which

FIG. 32 shows the contact pin of the tenth embodiment with the contact portions being closed, in which

FIG. 33 shows the contact pin of the tenth embodiment with the contact portions being opened, in which

FIG. 34 includes enlarged views showing a portion A in FIG. 29, in which FIG. 35 represents a conventional example, in which

DESCRIPTION OF THE PREFERRED EMBODIMENTS

Figure 1:
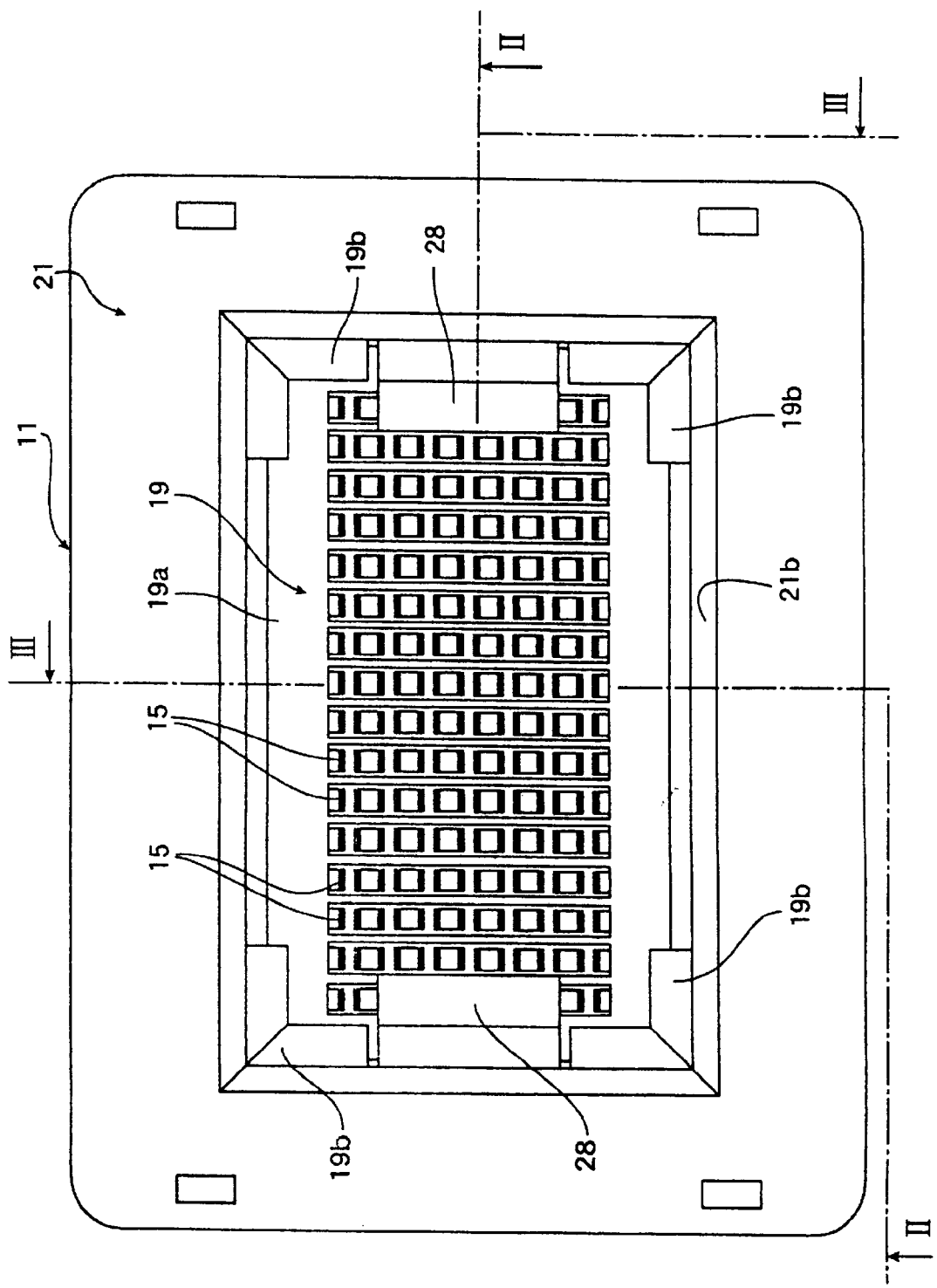
FIG. 1 is a plan view of an IC socket according to a first embodiment of the present invention.

Various preferred embodiments according to the present invention will be described hereunder with reference to the accompanying drawings.

[First Embodiment]

The first embodiment of the present invention is first mentioned hereunder with reference to FIGS. 1 to 9.

An IC socket as "socket for electrical parts" is generally shown by a reference numeral 11, and the IC socket 11 is for a socket for achieving an electrical connection between a printed circuit board, not shown, of a tester, for example, and a solder ball 12b as a terminal of an IC package 12 as "electrical part" for carrying out a performance test thereof.

Figure 4:
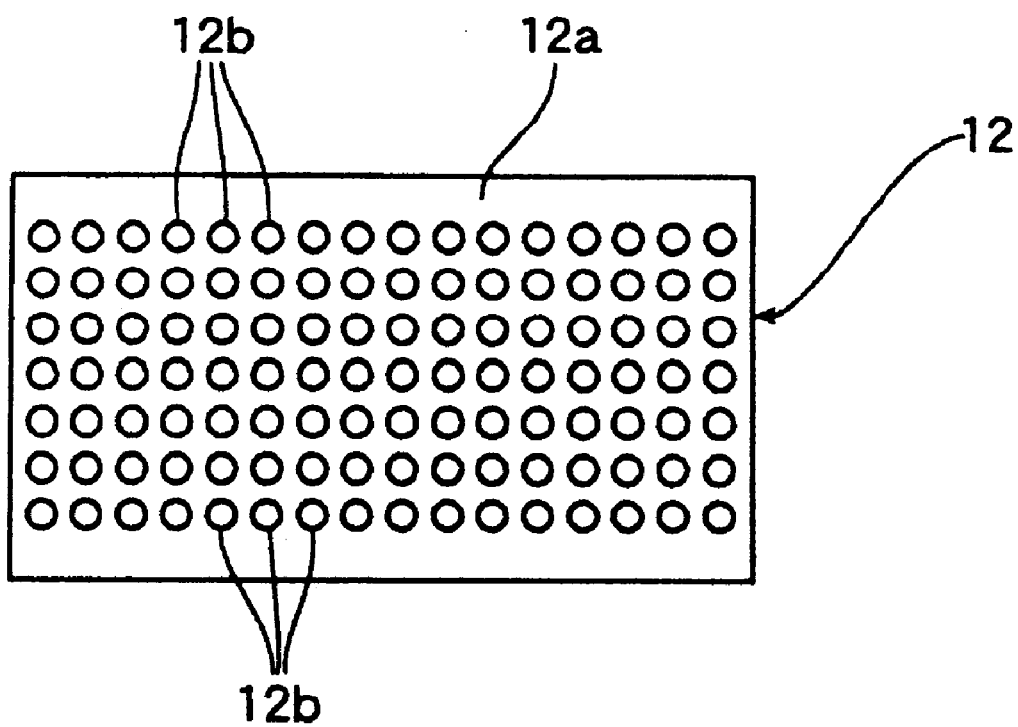
FIG. 4 is a bottom view of an IC package for the IC socket of FIG. 1.

The IC package 12 has a structure of so-called a BGA (Ball Grid Array) type as shown in FIG. 4, in which a number of substantially spherical solder balls 12b project from a lower surface of a package body 12a having, for example, a rectangular structure so as to provide a matrix arrangement.

The IC socket 11 has a socket body 13 which is mounted on the printed circuit board and to which a number of contact pins 15 contacting to or separating from the solder balls 12b are arranged. A movable plate for displacing the contact pins 15 is also arranged to the socket body 13, and an upper plate 19 is secured to the socket body 13 on the upper side of the movable plate 17. The movable plate 17 is moved up and down by an operation member 21 also arranged to the socket body 13.

Figure 5:
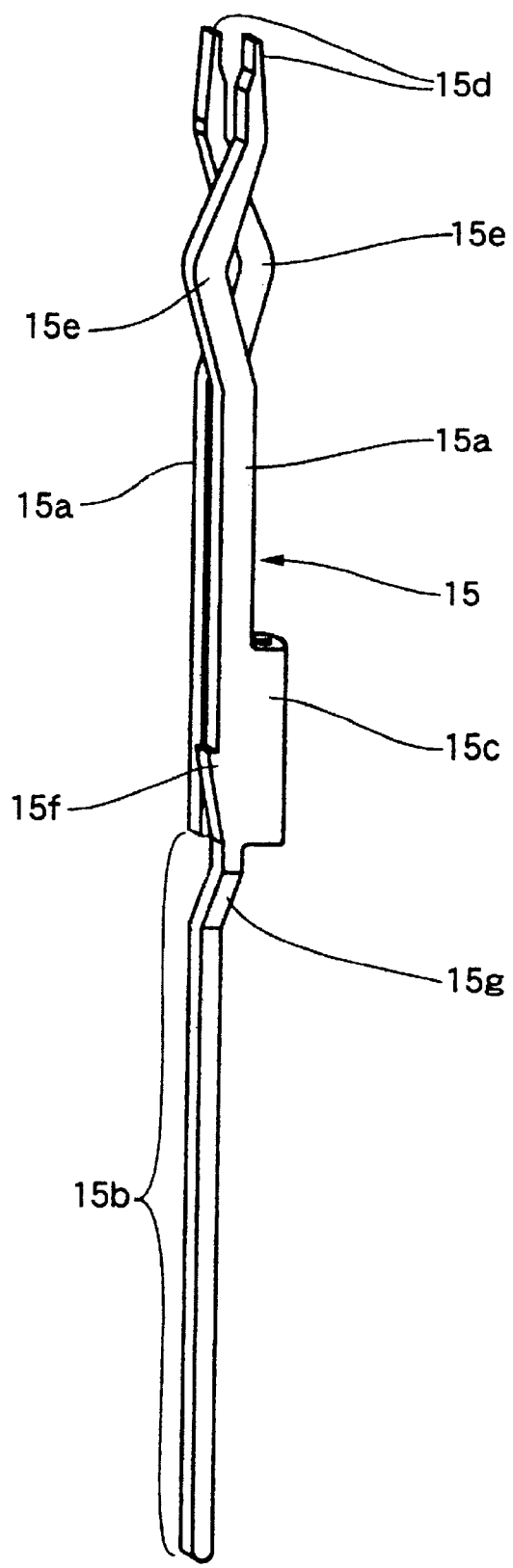
FIG. 5 is a perspective view of a contact pin, in an enlarged scale, in the first embodiment.

Each of the contact pins 15 is formed from a plate member having an elastic property and a conductivity through a press working in shape such as shown in FIG. 5.

That is, more in detail, an upper half of the contact pin 15 is formed into a fork shape having a pair of elastic pieces 15*a* and a lower half thereof is formed as a solder tail portion 15*b*. The elastic pieces 15*a* are integrated at lower end portions thereof as a common U-shaped base portion 15*c* so as to oppose to each other, and upper end (front end) portions of the elastic pieces 15*a* are formed with contact portions 15*d* contacting to or separating from side portions of the solder ball 12*b* to be capable of holding the solder ball 12*b* between the contact portions 15*d*. The contact portions 15*d* take a positional relationship shown in FIG. 8 in which the contact portions 15*d* are displaced from the diametral line of the spherical solder ball 12*b*.

Furthermore, the paired elastic pieces 15*a* are formed with <-shaped bent portions 15*e* so as to cross each other as shown in FIG. 5, for example. These bent portions 15*e* are pressed by a cam portion 17*a*, mentioned herein later, thereby to open the contact portions 15*d*.

The solder tail portion 15*b* and the base portion 15*c* of the contact pin 15 are fitted, under pressure, into a press-in hole 13*a* formed to the socket body 13*a* so that a biting portion 15*f* formed to the base portion 15*c* bites the socket body 13 thereby to prevent the contact pin 15 from coming out in an upward direction. The solder tail portion 15*b* projecting downward from the socket body 13, when fitted, further extends downward through a location board 26 and is fitted into a through hole formed to the printed circuit board, not shown. The fitted end portion of the solder tail portion 15*b* is thereafter soldered to the printed circuit board to be connected thereto.

Figure 3:
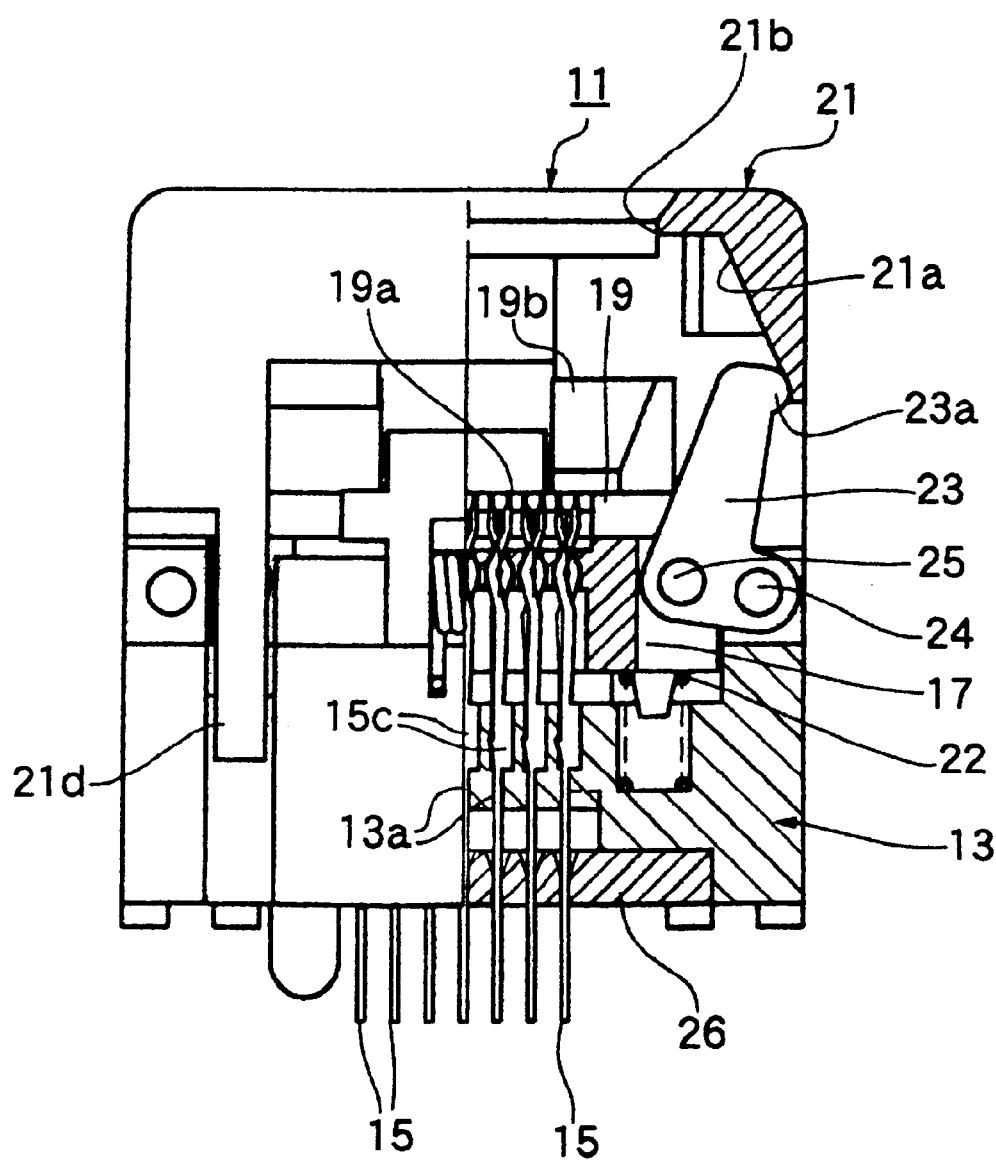
FIG. 3 is a sectional view taken along the line III—III in FIG. 1.

The movable plate 17 is, as best shown in FIG. 3, arranged to the socket body 13 to be vertically movable and urged upward by means of spring 22. A pair of arms 23, one of which is not illustrated, are also located so as to move upward the movable plate 17. The arm 23 is mounted to the socket body 13 to be pivotal by means of a shaft pin 24 and also mounted to the movable plate 17 to be pivotal by means of a shaft pin 25, and the upper end portion 23*a* of the arm 23 contacts a cam surface 21*a* of the operation member 21 to be slidable. According to the structure mentioned above, when the operation member 21 is lowered, the upper end portion 23*a* of the arm 23 is pressed by the cam surface 21*a*, and hence, the arm 23 itself is rotated about the shaft pin 24 in a counterclockwise direction in FIG. 3, thus moving downward the movable plate 17.

Figure 7A:
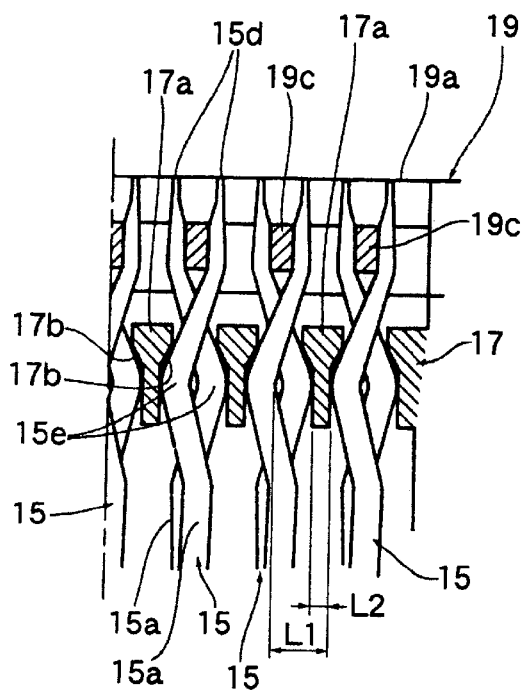
FIG. 7A shows a state that a pair of contact portions of the contact pin are closed.
Figure 7B:
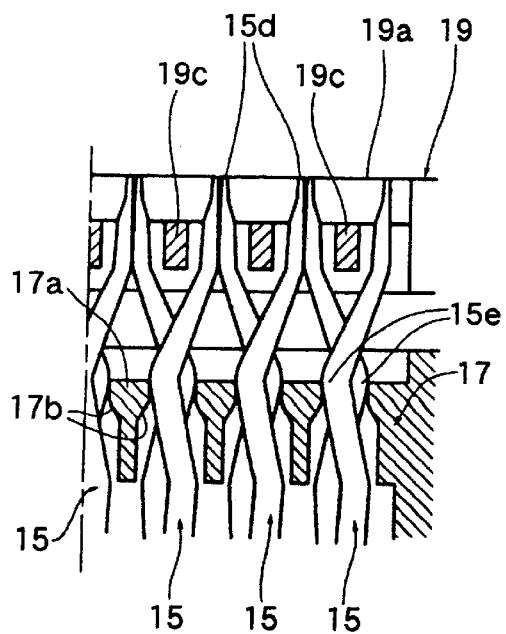
FIG. 7B shows a state that a pair of contact portions of the contact pin are opened.
Figure 7C:
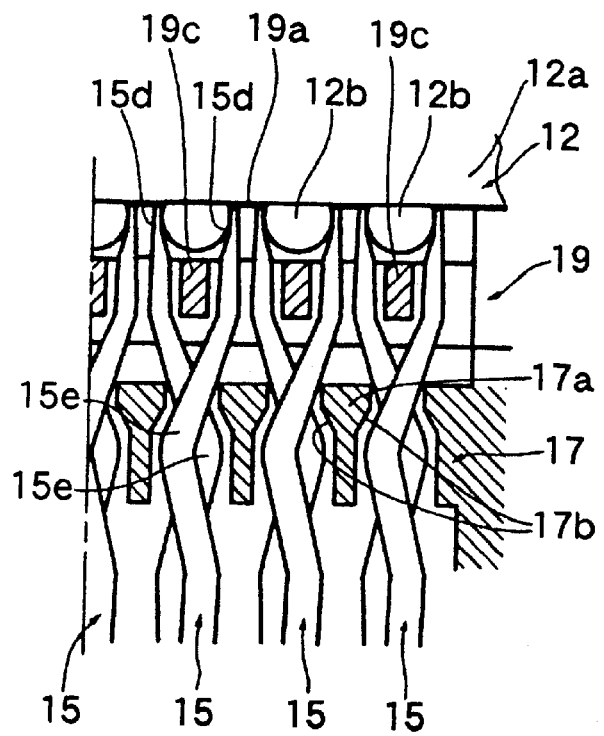
FIG. 7C shows a state that a solder ball is clamped between the paired contact portions of the contact pin.

Then, with reference to FIGS. 7A to 7C, the movable plate 17 is formed with cam portions 17*a*, each being positioned between adjacent contact pins 15, and on both sides of the cam portion 17*a*, slide portions 17*b* are formed so as to press the bend portions 15*e* of the elastic pieces 15*a* of the adjacent contact pins 15. That is, one cam portion 17*b* can press the bent portions 15*e* of the elastic pieces 15*a* of the contact pins 15 positioned on both the sides of the cam portion 17*b*. Therefore, both the contact portions 15*d* of the contact pins 15 can be opened from each other by pressing these bent portions 15*e* in a direction approaching each other by a pair of cam portions 17*a* disposed on both the sides of the contact pin 15.

The upper plate 19 mentioned hereinbefore has a mount surface portion 19*a* on which the IC package 12 is mounted and also has guide portions 19*b*, as shown in FIG. 1, at four corner portions of the upper plate 19, corresponding to four corner portions of the IC package 12, for positioning the IC package 12 at a predetermined position. The upper plate 19 is further formed with positioning ribs 19*c* which are to be inserted between the paired contact portions 15*d* of the respective contact pins 15, and under a condition that any external force is not applied to both the elastic pieces 15*a* of the contact pin 15 (i.e. a condition that both the contact portions 15*d* are closed), each of the positioning ribs 19*c* is clamped by both the elastic pieces 15*a*.

Furthermore, the operation member 21 has an opening 21*b*, as shown in FIG. 1, for example, having a size capable of the IC package 12 being inserted thereinto, and when the IC package 12 is inserted into the opening 21*b* and then mounted to the predetermined position of the mount surface portion 19*b* of the upper plate 19. Further, as shown in FIG. 3, the operation member 21 is arranged to be movable vertically with respect to the socket body 13 and urged upward by means of the spring 27. The operation member 21 is further formed with an engaging claw piece 21*d*, which is engaged with an engagement portion of the socket body 13 at the uppermost moved position of the operation member 21 thereby to prevent the operation member from coming off.

Figure 2:
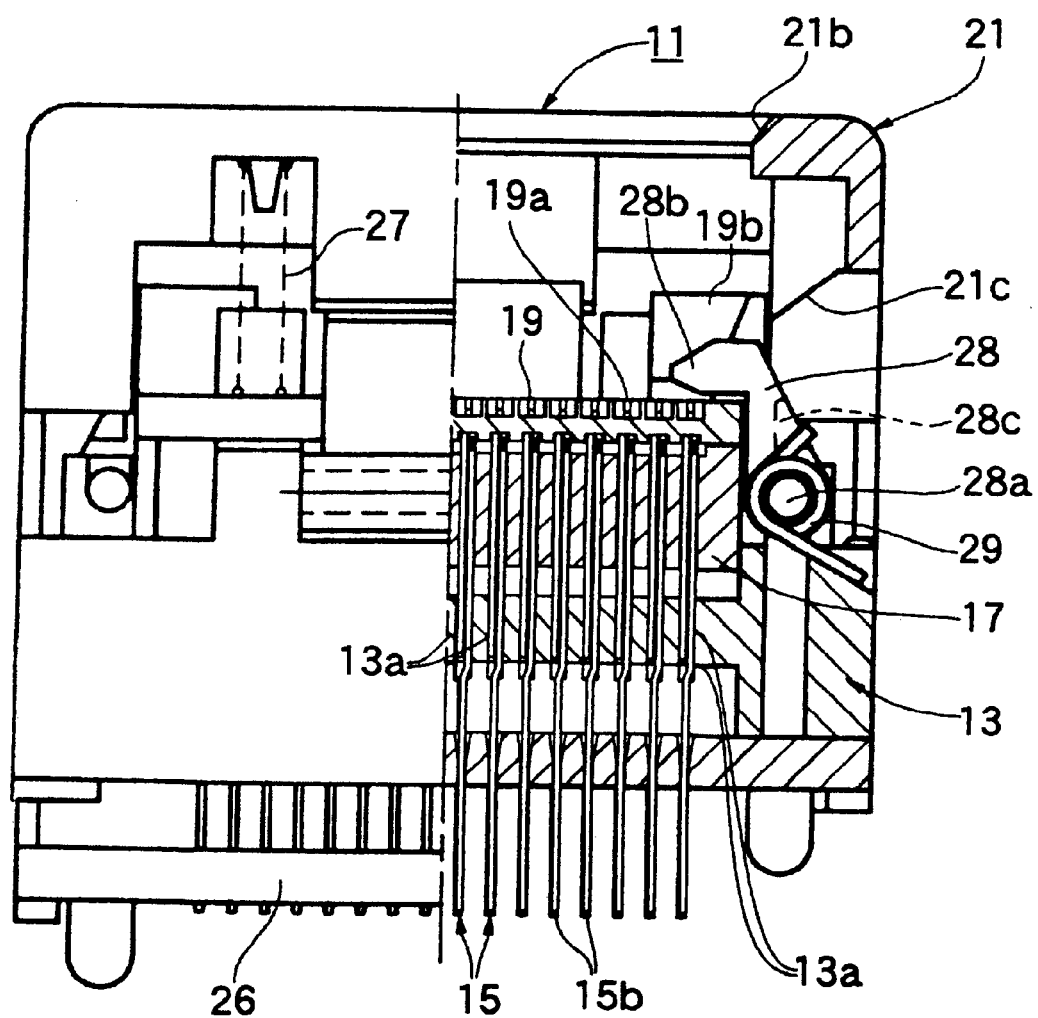
FIG. 2 is a sectional view taken along the line II—II in FIG. 1.

The operation member 21 is further formed with a cam surface 21*a* for rotating the arm 23 and an operating portion 21*c* rotating the latch 28 as shown in FIG. 2, for example. The latch 28 is secured to the socket body 13 to be rotatable about a shaft pin 28*a* and urged by means of a spring 29 in a counterclockwise direction in FIG. 2 so that a press holding portion 28*b* formed to the front end portion of the latch 28 holds a peripheral portion of the IC package 12. The latch 28 is formed with a depressed portion 28*c* on which the operating portion 21*c* of the operation member 21 slides, and when the operation member 21 is lowered, the depressed portion 28*c* slides on the operating portion 21*c* and the latch 28 is thereby rotated in a clockwise direction as shown in FIG. 9B so that the press holding portion 28*b* is retired from the IC package arranging position.

The first embodiment of the structures mentioned above will operate in the following manner.

Figure 6:
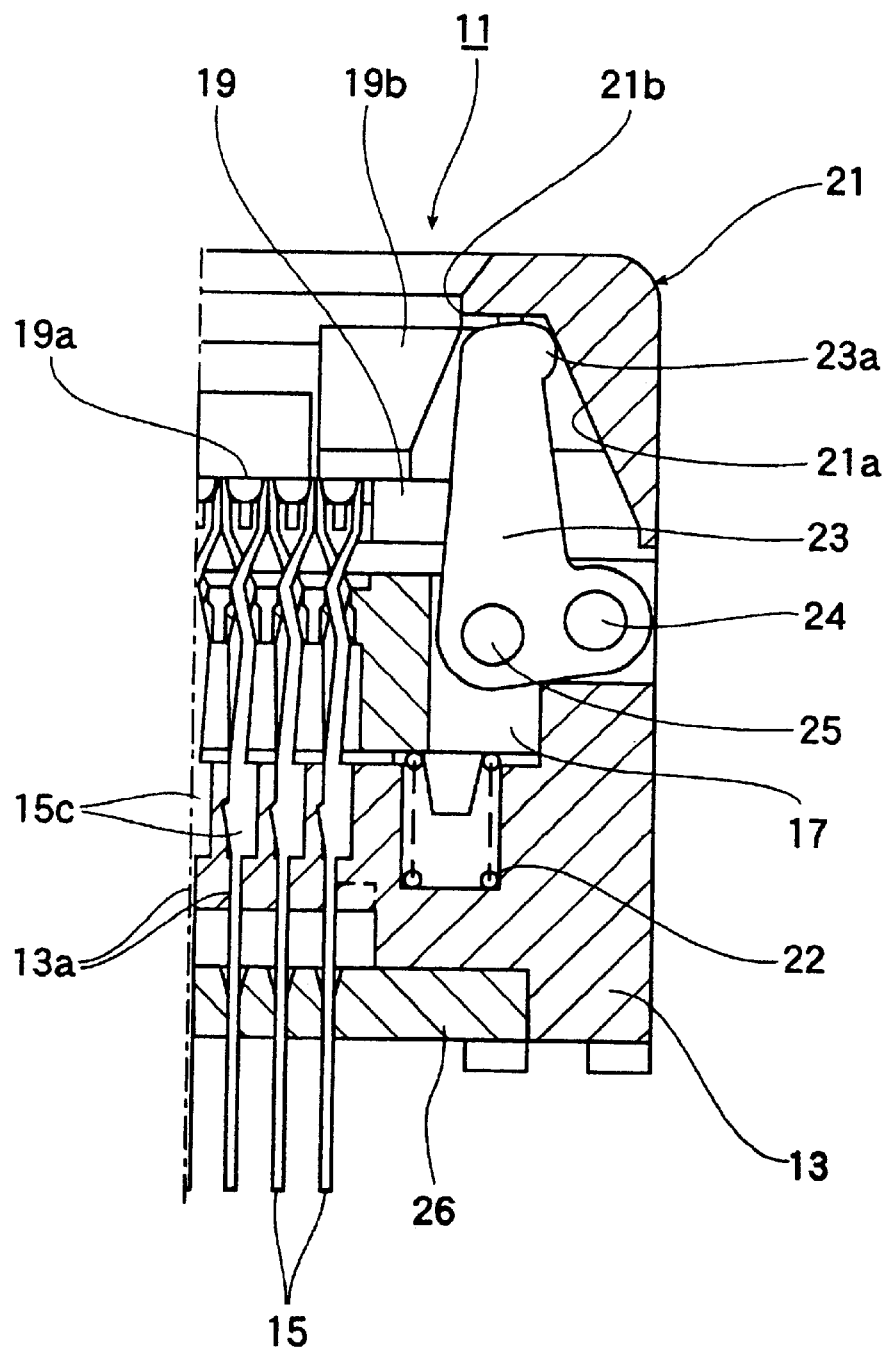
FIG. 6 is a sectional view showing a state that an operation member in the first embodiment is lowered.

When the IC package 12 is set to the IC socket 11, the operation member 11 is first depressed downward, and at this time, the arms 23 are rotated by the cam surfaces 21*a* of the operation member 21 in the counter-clockwise direction as shown in FIG. 6 and the movable plate 17 is hence lowered. When the movable plate 17 is lowered, the cam portions 17*a* thereof are also lowered as shown in FIGS. 7A and 7B, and owing to the operation of the sliding surfaces 17*b* of the cam portions 17*a*, the bent portions 15*e* of the contact pins 15 are pressed and the paired contact portions 15*d* are opened as shown in FIG. 7B.

Figure 9A:
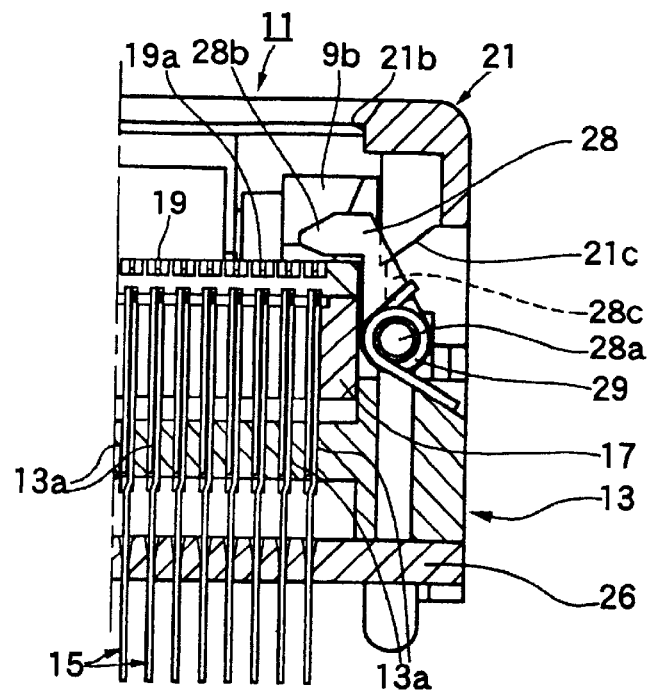
FIG. 9A shows a state that the operation member is positioned to a raised position and FIG. 9B shows a state that the operation member is positioned to a lowered position.
Figure 9B:
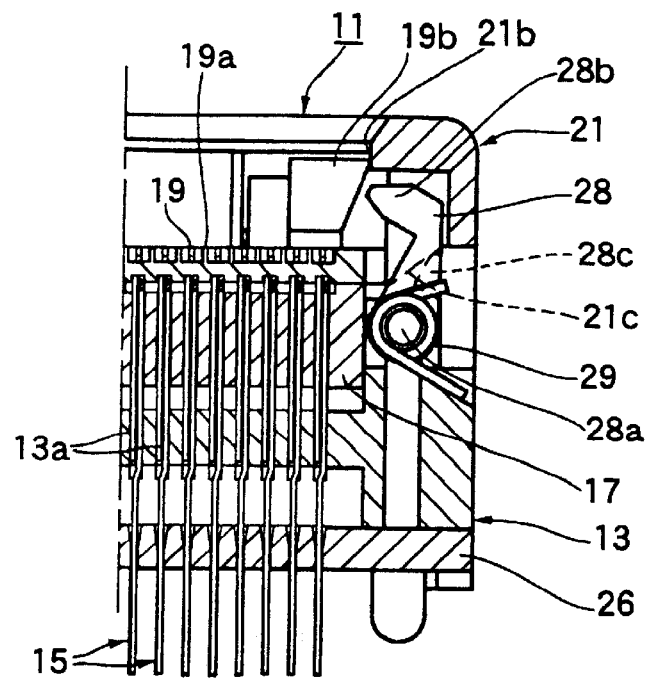

At the same time, the depressed portion 28*c* of the latch 28 is depressed by the operating portion 21*c* of the operation member 21 and then rotated in the clockwise direction against the urging force of the spring 29 from the state shown in FIG. 9A to the state shown in FIG. 9B and the depressed portion 28*b* is displaced to the retired position.

Under the state mentioned above, the IC package 12 is mounted to the predetermined position of the mount surface portion 19*a* of the upper plate 19 while being guided by the guide portions 19*b*, and the respective solder balls 12*b* of the IC package 12 are inserted into the opened paired contact portions 15*d* of the respective contact pins 15 under no-contacting condition.

Thereafter, when the downward pressing force applied to the operation member 21 is released, the operation member 21 is moved upward by means of the urging force of the spring 27 and the movable plate 17 is hence moved upward by means of the spring 22, whereby the latch 28 can be rotated in the counterclockwise direction in FIG. 9 by the urging force of the spring 29.

When the movable plate 17 is rotated, the pressing force to the bent portions 15e of the contact pins 15 by the cam portions 17a is released and the paired contact portions 15d of the contact pins 15 are moved in a direction to close the same (i.e. make narrow the distance therebetween) thereby to clamp the solder balls 12b therebetween as shown in FIG. 7C.

According to the operation mentioned above, the electrical connection between the solder balls 12b of the IC package 12 and the printed circuit board can be established.

On the other hand, when it is required to remove the IC package 12 from its mounted condition, the operation member 21 is also moved downward thereby to separate the paired contact portions 15d of the contact pins 15 from the solder balls 12b. According to such operation, the IC package 12 can be easily removed with a force weaker than a pulling force for withdrawing the solder ball 12b from the paired contact portions 15d.

With the structure and operation mentioned above, since the cam portion 17a of the movable plate 17 for opening or closing the paired contact portions 1d of the contact pin 15 is not inserted into a space between both the contact portions 15d and is disposed between the adjacent contact pins 15, it is not necessary to insert the cam portion 17a between the closed contact portions 15d at the time of arranging the movable plate 17, so that the assembling workability of the IC socket can be remarkably improved.

Furthermore, since the paired elastic pieces 15a of one contact pin 15 cross each other, in a case where a distance Li between one elastic piece 15a of one contact pin 15 and one elastic piece 15a of adjacent one contact pin 15 as shown in FIG. 7A is ensured, a distance L2 between the other one elastic piece 15e of one contact pin 15 and the other one elastic piece 15e of the adjacent other one contact pin 15 can be neglected, thus the respective contact pins 15 being arranged with narrow pitch.

Furthermore, the contact pin 15 has the <-shaped bent portions 15e and has substantially the same width along the entire length thereof without making a portion of the elastic piece 15a large, so that a stress is not concentrated at one point of the contact pin 15 and dispersed substantially entirely, thus the flexibility of the elastic pieces being improved.

Still furthermore, according to the structure of the first embodiment of the present invention, since the elastic pieces 15a of both the adjacent two contact pins 15 are pressed and flexed by the one cam portion 17a of the movable plate 17, the entire structure of the IC socket can be made compact.

Still furthermore, since the contact pin 15 has a structure such that the base portion 15c of the contact pin 15 is bent to provide substantially U-shape to oppose a pair of elastic pieces 15a to each other, the contact pin 15 can be manufactured from one sheet of plate member through a press working. Moreover, since the positioning ribs 19c are formed to the upper plate 19, the exact arrangement or positioning can be achieved by preliminarily applying a small load to the contact portions 15d of the contact pins 15.

[Second Embodiment]

Figure 10:
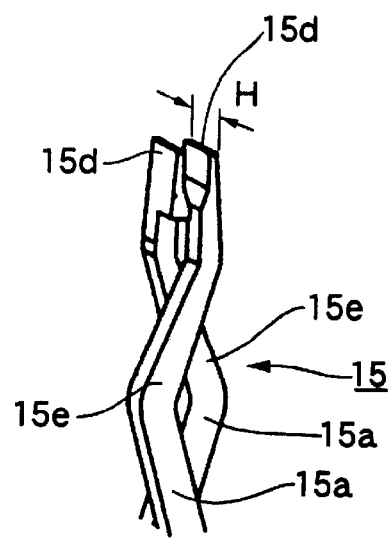
FIG. 10 is a perspective view of an upper portion of a contact pin according to a second embodiment of the present invention.
Figure 11:
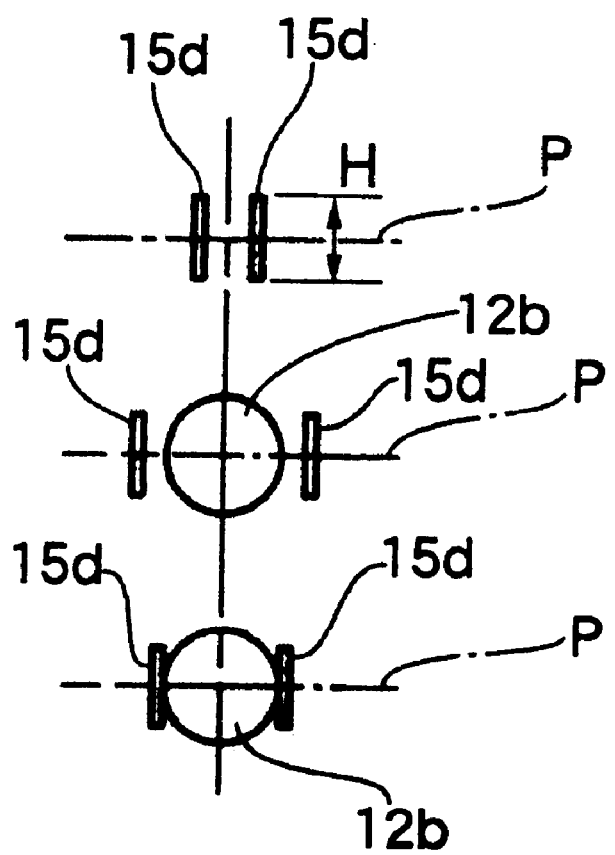
FIG. 11 includes plan views of the paired contact portions of the contact pin for showing a function of the second embodiment, including a state that a pair of contact portions of the contact pin are closed, a state that a pair of contact portions of the contact pin are opened, and a state that a solder ball is clamped between the paired contact portions of the contact pin.

FIGS. 10 and 11 represent the second embodiment of the present invention, and this second embodiment differs from the first embodiment in the structure of the contact portions 15d of the contact pin 15.

That is, with reference to FIGS. 10 and 11, the width H between the contact portions 15d of the contact pin 15 of the second embodiment is made widen in comparison with the first embodiment, and the contact portions 15d are opposed to each other on both the sides of the solder ball 12b above the diametral line P thereof so that contacting surfaces of the contact portions 15d are perpendicular to the diametral line P.

Figure 8A:
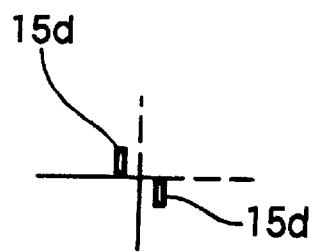
FIG. 8A shows a state that a pair of contact portions of the contact pin are closed.
Figure 8B:
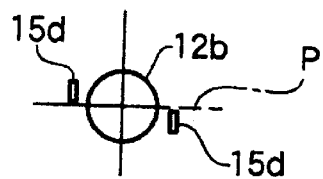
FIG. 8B shows a state that a pair of contact portions of the contact pin are opened.
Figure 8C:
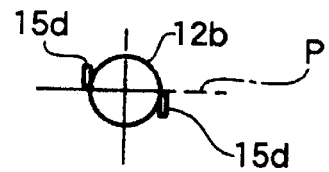
FIG. 8C shows a state that a solder ball is clamped between the paired contact portions of the contact pin.

According to the structure of the contact pin 15 mentioned above, the edge portions of the contact portions 15d never contact the solder ball 12b as shown in FIG. 8, so that the solder ball 12b can be prevented from being damaged through such contacting.

As the other structures are substantially the same as those in the first embodiment mentioned above, the details thereof are omitted herein.

[Third Embodiment]

Figure 12A:
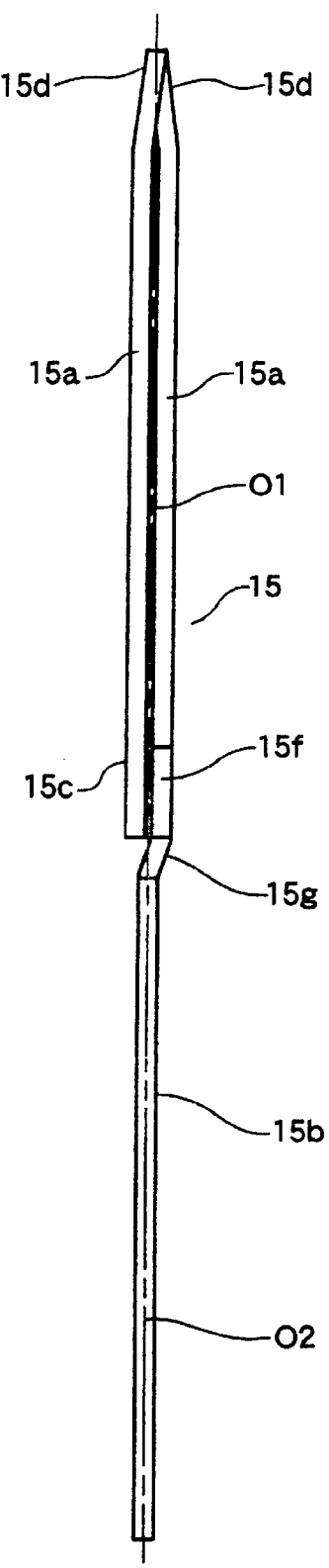
FIG. 12A is a front view thereof and FIG. 12B is a right-side view thereof.
Figure 12B:
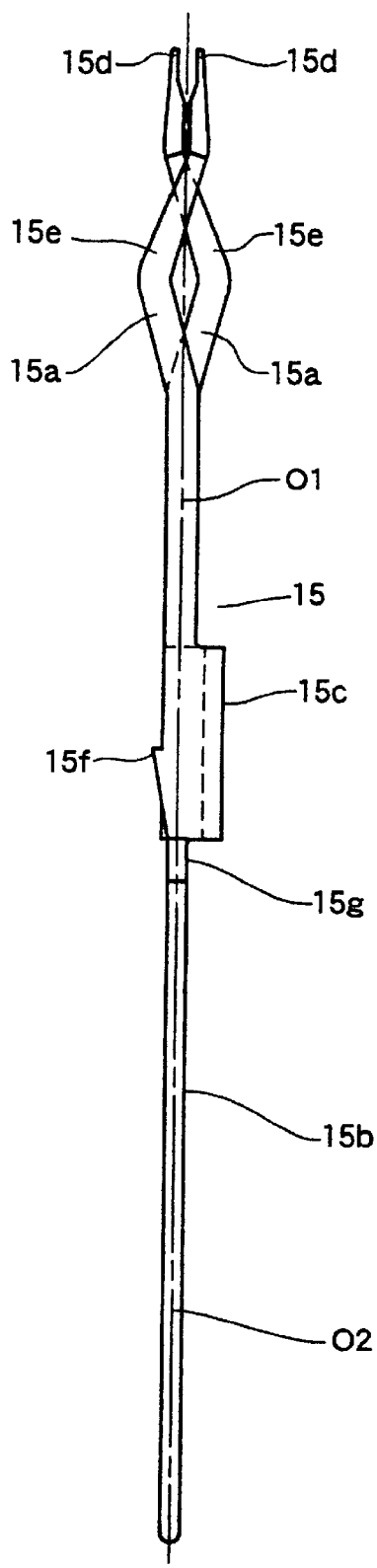
Figure 13:
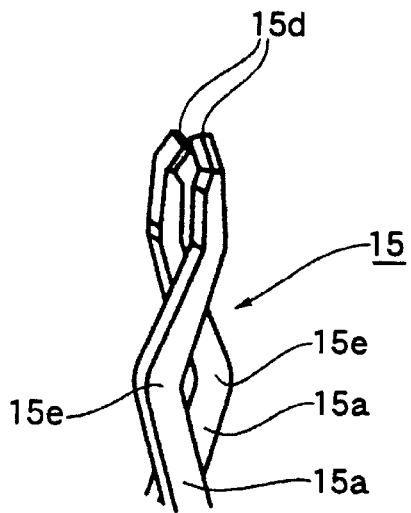
FIG. 13 is a perspective view showing an upper portion of the contact pin of the third embodiment.
Figure 14A:
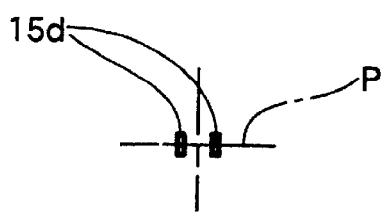
FIG. 14A shows a state that a pair of contact portions of the contact pin are closed.
Figure 14B:
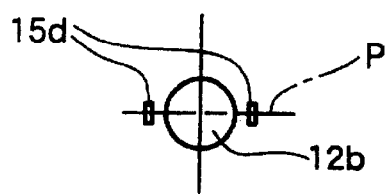
FIG. 14B shows a state that a pair of contact portions of the contact pin are opened.

FIGS. 12 to 14 represent the third embodiment of the present invention, in which the contact pin 15 has a pair of contact portions 15d which are bent towards each other as shown in FIG. 13 and opposed to each other on both the sides of the solder ball 12b as shown in FIG. 14. The contact portions 15d are positioned on the diametral line P of the solder ball 12b and the contacting surfaces of the contact portions 15d are positioned to be perpendicular to the diametral line P.

Figure 14C:
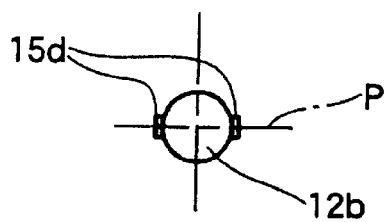
FIG. 14C shows a state that a solder ball is clamped between the paired contact portions of the contact pin.

According to the structure of the third embodiment mentioned above, the edge portions of the contact portions 15d never contact the solder ball 12b as shown in FIG. 14C, so that the solder ball 12b can be prevented from being damaged through such contacting.

In the structure of the contact pin 15 of this embodiment, as shown in FIG. 12, the solder tail portion 15b is bent at a portion 15g near the base portion 15c of the elastic pieces 15a so that the center line O1 of the paired elastic pieces 15a accords with the center line O2 of the solder tail portion 15b. Further, it is to be noted that, in the structures of the first and second embodiments mentioned above, the contact pins 15 are formed so that both the center lines O1 and O2 are coincident with each other.

The arrangement of the coincidence of these center lines O1 and O2 can facilitate the setting of the IC package 12 to a plurality of IC sockets 11 mounted on the printed circuit board by conveying the IC package by an automatic machine, for example.

That is, the coincidence of both the center lines O1 and O2 means the coincidence of positional arrangement of the solder balls 12b with positional arrangement of the through holes formed to the printed circuit board as viewed in plane. Accordingly, in a setting such that the IC package 12 is conveyed by the automatic machine with an optional position of the printed circuit board being the reference, the IC package can be set to the predetermined positions of the IC sockets 11 with high accuracy only by grasping the positional relationship between the reference position of the printed circuit board and the through holes formed thereto without paying any attention to the positional relationship between the printed circuit board and the IC sockets 11.

The above merit may not be a so significant matter as far as the structure of a straight contact pin 15 is adopted. However, in the present invention, the contact pin 15 has the base portion 15c bent so that a pair of elastic pieces 15a are opposed to each other and the solder tail portion 15b extends downward therefrom, and accordingly, the center lines O1 and O2 cannot be made coincident with each other only by extending downward the solder tail portion 15b. In order to obviate such fact, in the present invention, as mentioned above, the portion 15g near the base portion 15c is bent to achieve the coincidence of both the center lines O1 and O2. Hence, according to such structure of the present invention, the advantageous effects mentioned above is obtainable.

The other structures of this embodiment are substantially the same as those mentioned with reference to the first embodiment, so that the details thereof are omitted herein.

[Fourth Embodiment]

Figure 15A:
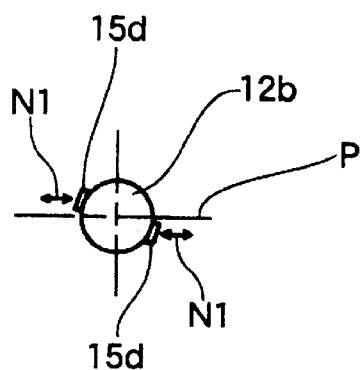
FIGS. 15A, 15B and 15C show contact pins having different contact portions, respectively.
Figure 15B:
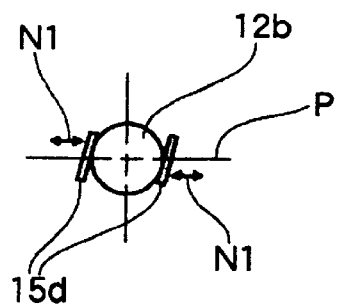
Figure 15C:
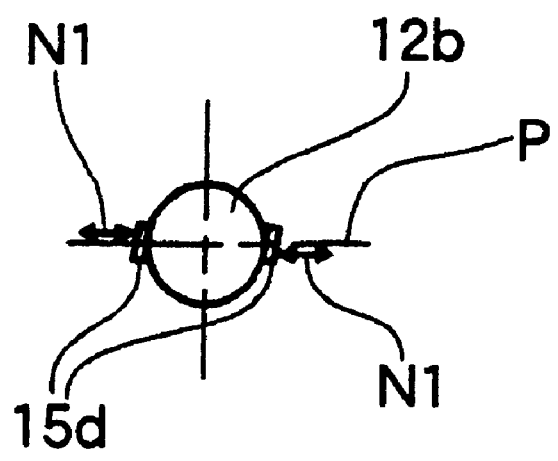

FIG. 15 represents the fourth embodiment of the present invention, in which FIGS. 15A, 15B and 15C show modified embodiments of the first, second and third embodiments mentioned hereinbefore, respectively, wherein a pair of contact portions 15d have contacting surfaces contacting the spherical solder ball 12b which are inclined with respect to displaced or biased directions N1 of the contact portions 15d as shown by arrows in the respective figures.

According to such arrangements, the contact portions 15d slide on the surface of the solder ball 12b when the paired contact portions 15d clamp the solder ball 12b and an oxide film on the surface of the solder ball 12b is broken thereby to establish a stable electrical contact.

The other structures of this embodiment are substantially the same as those mentioned with reference to the first embodiment, so that the details thereof are omitted herein.

[Fifth Embodiment]

Figure 16A:
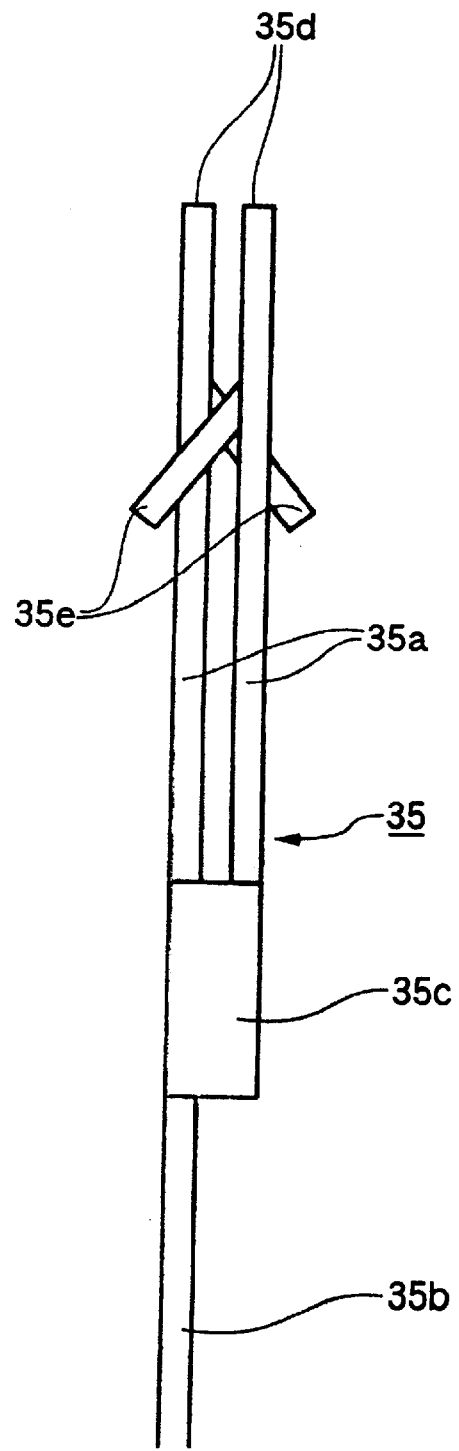
FIG. 16A is a front view thereof and FIG. 16B is a perspective view thereof.
Figure 16B:
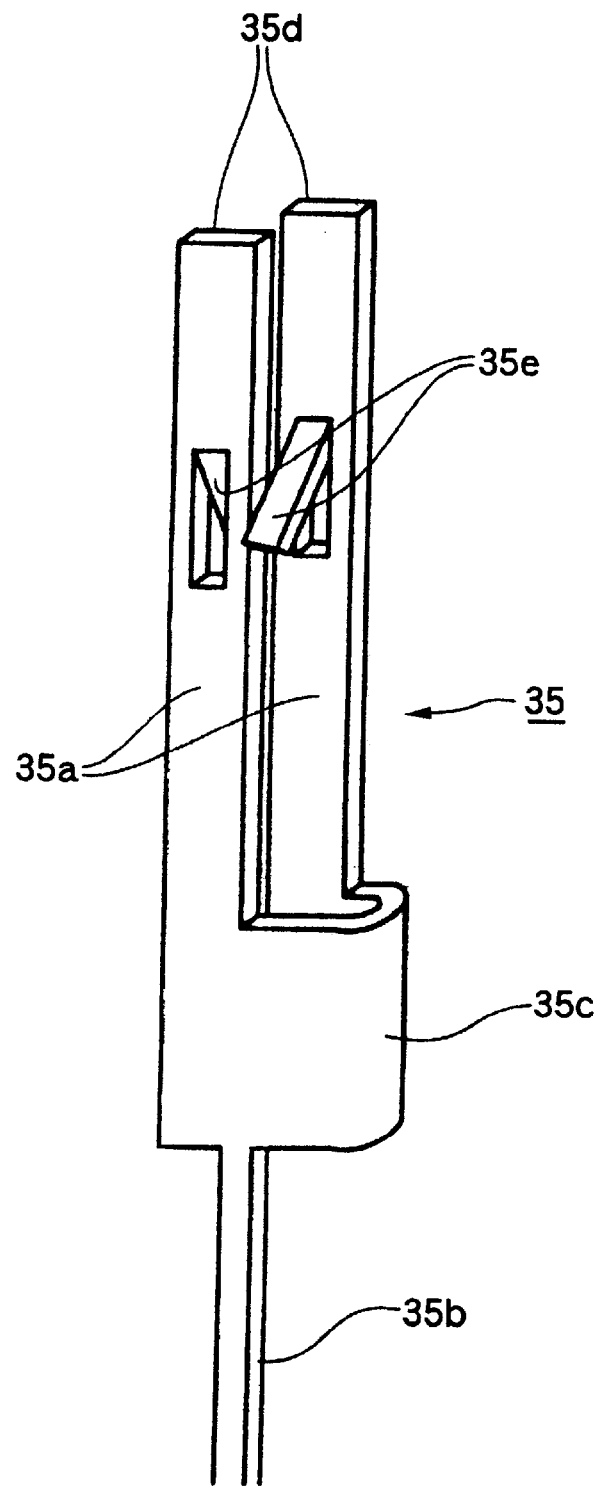

FIG. 16 represents the fifth embodiment of the present invention, in which a contact pin 35 of this embodiment differs from the contact pin 15 of the first embodiment.

The contact pin 35 has a pair of elastic pieces 35a and a solder tail portion 35b formed below the elastic pieces 35a, and the lower portions thereof are formed as a bent base portion 35c in U-shape so that the paired elastic pieces 35a are opposed to each other. The front, i.e. upper as viewed, end portions are formed as contact portions 35d contacting the solder ball 12b. Projecting pieces 35e projecting towards each other are formed to the elastic pieces at portions below the contact portions 35d by cutting portions of the elastic pieces 35a and raising the cut portions so as to extend obliquely downward. These projecting pieces 35e are formed so as to open both the contact portions 35d when pressed by the cam portion 17a of the movable member 17 as mentioned with reference to the first embodiment.

The other structures of this embodiment are substantially the same as those mentioned with reference to the first embodiment, so that the details thereof are omitted herein.

[Sixth Embodiment]

Figure 17:
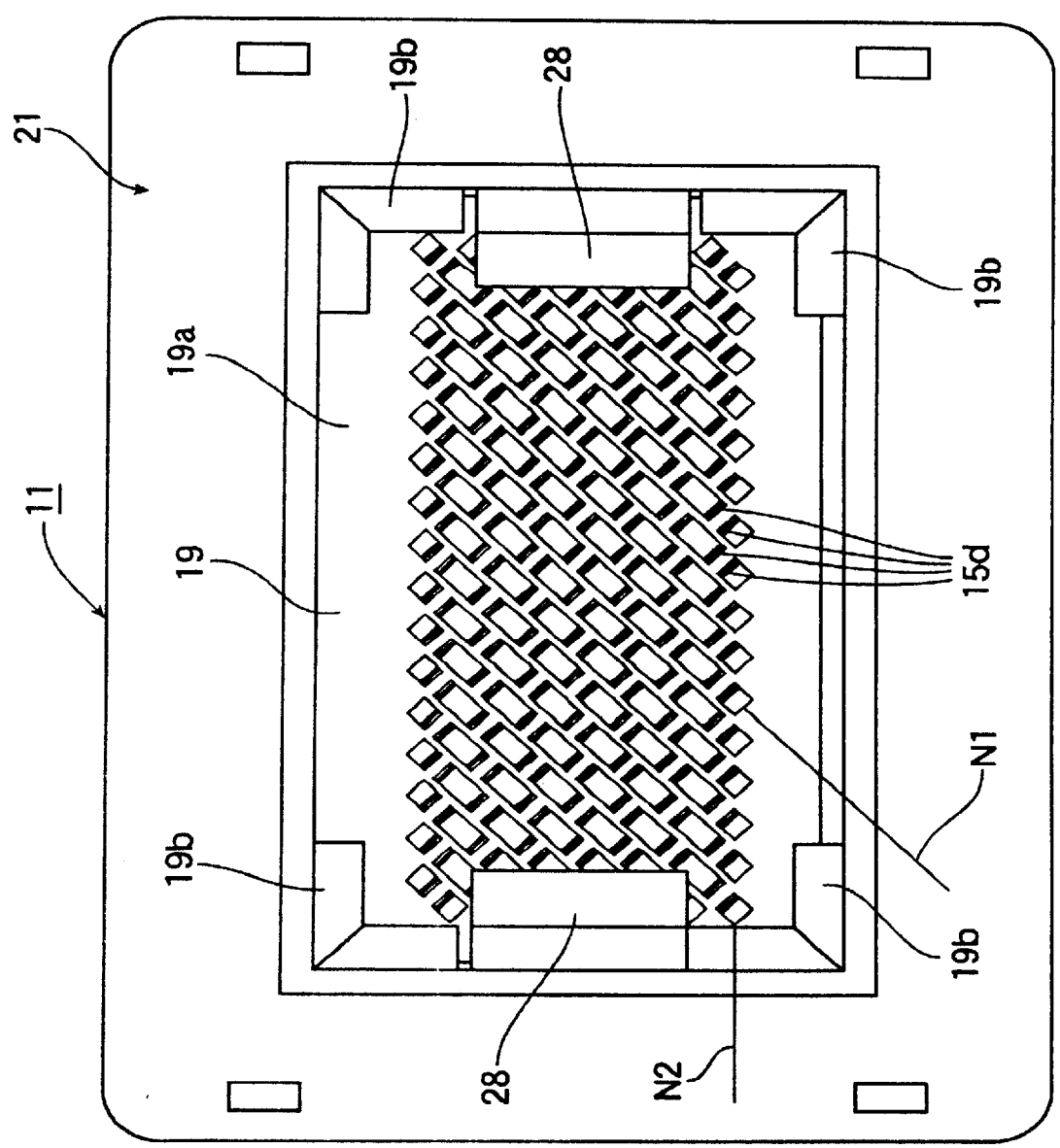
FIG. 17 is a plan view showing an IC socket according to a sixth embodiment of the present invention.

FIG. 17 represents the sixth embodiment of the present invention, in which a number of contact pins 15 are arranged in matrix shape in a manner that the displaced direction N1 of the paired contact portions 15d of the respective contact pins 15 are arranged at predetermined angle (45° in this embodiment) with respect to the arrangement direction N2 of the contact pins 15.

According to such arrangement, the contact pins 15 can be arranged with narrow pitch. That is, the contact portions 15d are opened or closed along their displaced direction N1, and accordingly, it is necessary to ensure a space for allowing the contact portions to be opened or closed in the direction N1. Therefore, the narrow pitch of the contact pin 15 can be ensured by changing the direction of the contact portions 15d with certain constant angles with respect to the arrangement direction N2 of the contact pins 15.

The other structures of this embodiment are substantially the same as those mentioned with reference to the first embodiment, so that the details thereof are omitted herein.

[Seventh Embodiment]

FIGS. 18 to 22 represent the seventh embodiment of the present invention, in which a contact pin 16 has a structure different from the contact pin 15 of the first embodiment.

That is, in this seventh embodiment, the contact pin 16 has a pair of elastic pieces 16a and 16b to an upper portion thereof and one solder tail portion 16c formed at the lower portion of the contact pin 16. The lower portions of the elastic pieces 16a and 16b are formed as a bent base portion 16d in U-shape so that the paired elastic pieces 35a are opposed to each other as shown in FIG. 18. Contact portions 16e and 16f are formed to the upper, as viewed, i.e. front, end portions of the elastic pieces 16a and 16b so as to be contacted to or separated from the side portions of the spherical solder ball 12b as shown in FIG. 19 thereby to clamp the solder ball 12b to establish the electrical connection. The contact portions 16e and 16f are positioned substantially on the diametral line of the spherical solder ball 12b.

The elastic pieces 16a and 16b of the contact pin 16 are formed with portions 16g bent in <-shape, which are pressed by the cam portions 17a of the movable plate 17 thereby to open the contact portions 16e and 16f as in the first embodiment.

Figure 18A:
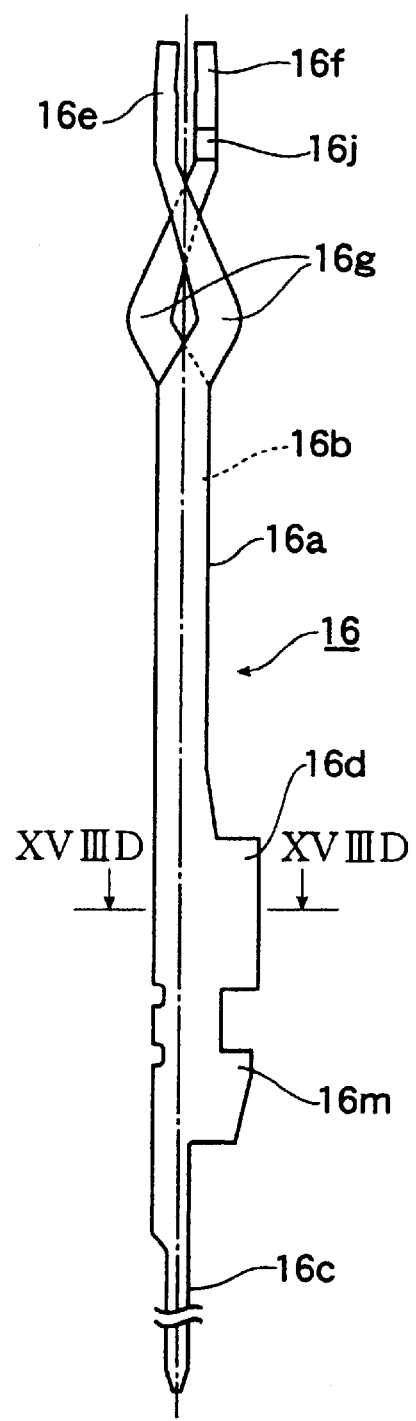
FIG. 18A is a front view thereof.
Figure 18B:
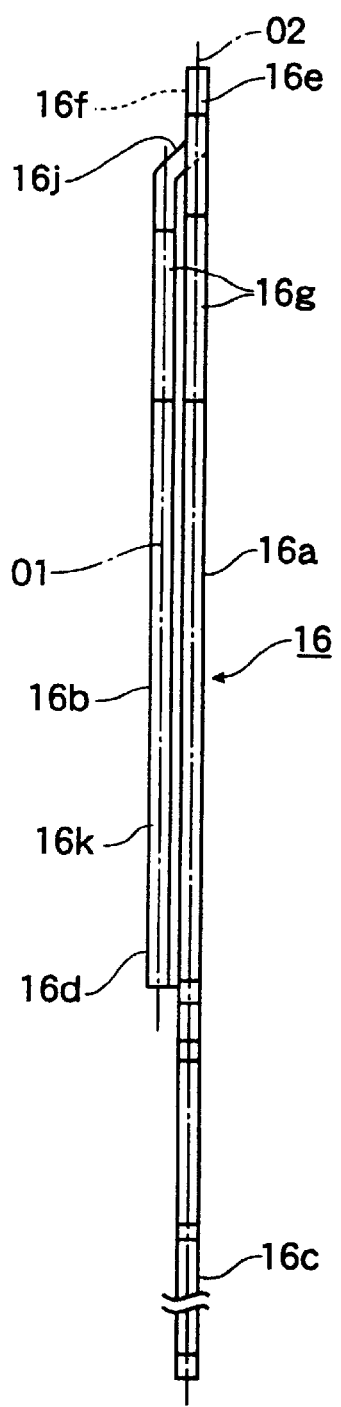
FIG. 18B is a left-side view of FIG. 18A.
Figure 18C:
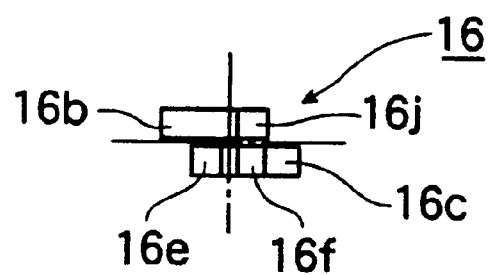
FIG. 18C is a plan view thereof.
Figure 18D:
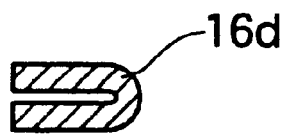
FIG. 18D is a sectional view taken along the line XVIIID—XVIIID in FIG. 18A.
Figure 19:
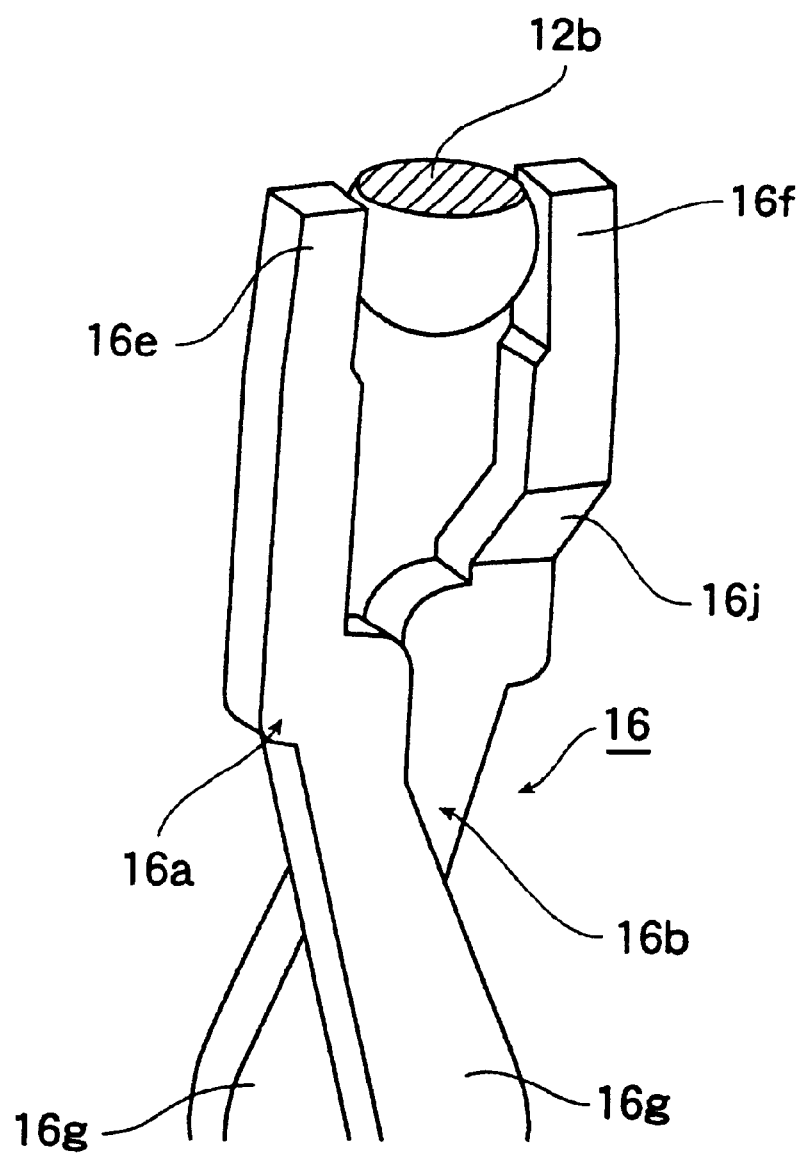
FIG. 19 is a perspective view showing the contact pin of the seventh embodiment which holds a solder ball.
Figure 20:
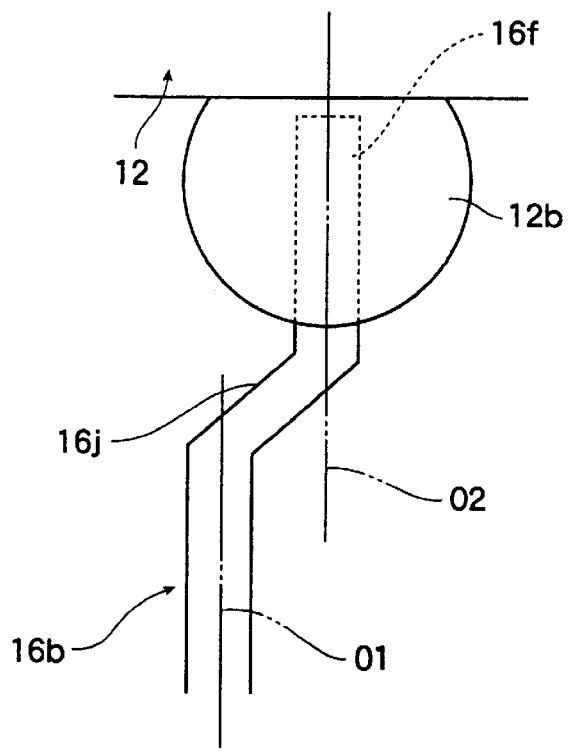
FIG. 20 is a front view, according to the seventh embodiment, showing a state of the solder ball and an elastic piece of the contact pin viewed from the side thereof.

Furthermore, one 16b of the paired elastic pieces 16a and 16b of the contact pin 16 is formed with a crank portion 16J at a portion above the bent portion 16g so that an axis O1 passing a root portion 16k of one elastic piece 16b and an axis O2 passing the contact portion 16f are offset from each other as shown in FIG. 18B, for example.

When the solder tail portion 16c and the base portion 16d of the contact pin 16 are press fitted into the press-in hole 13a formed to the socket body 13, a come-off preventing portion 16m formed to the base portion 16d bites the socket body 13 thereby to prevent the contact pin 16 from coming off upward. Of course, a number of such press-in holes 13a are formed to the socket body 13 so as to correspond to a number of contact pins 16. The solder tail portions 16c projecting downward from the socket body 13 further extend downward through a location board 26 and are then inserted into the through holes formed to the printed circuit board and soldered thereto, thus being connected.

Figure 22A:
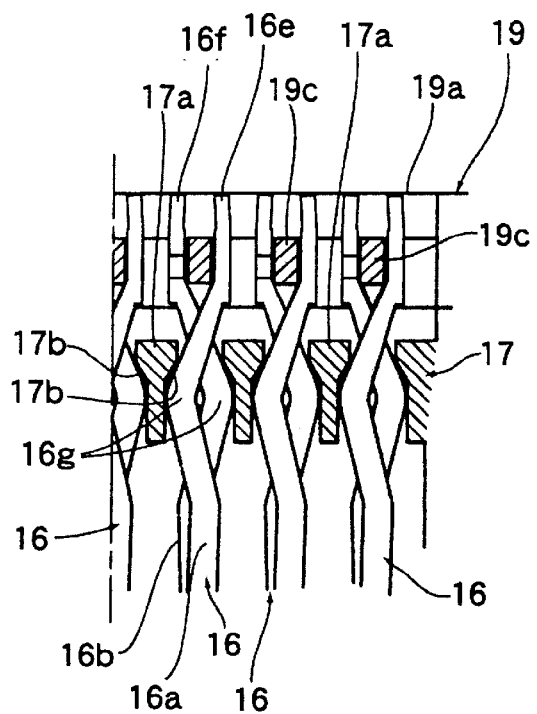
FIG. 22A shows a state that a pair of contact portions of the contact pin are closed.

Furthermore, as shown in FIG. 22, the upper plate 19 has the mount surface portion 19a on which the IC package 12 is mounted and is formed with positioning ribs 19c each being inserted between the paired contact portions 16d of each contact pin 16 in a manner such that each of the positioning ribs 19c is clamped by both the elastic pieces 16a and 16b in a state that any external force is applied to the elastic pieces 16a and 16b (in a state that both the contact portions 16e and 16f are closed) as shown in FIG. 22A.

Figure 22B:
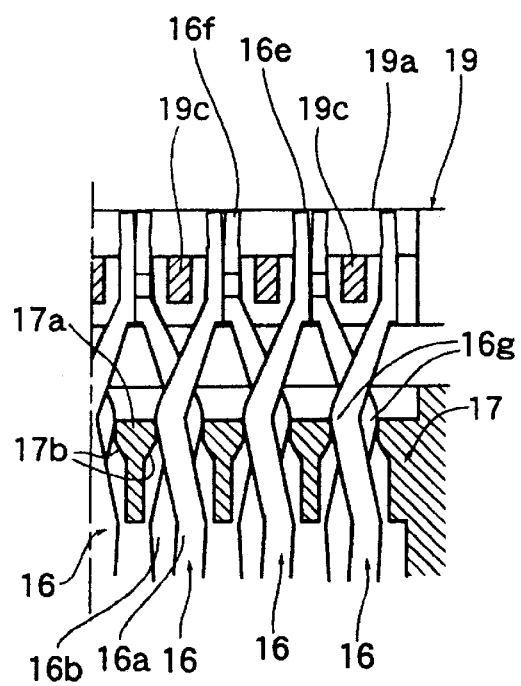
FIG. 22B shows a state that a pair of contact portions of the contact pin are opened.

In this seventh embodiment of the structure mentioned above, when the movable plate 17 is lowered, as in the first embodiment, both the bent portions 16g of the contact pin 16 are pressed by the sliding surfaces 17b of the cam portions 17a and the paired contact portions 16e and 16f are hence opened as shown in FIG. 22B. Under this state, the IC package 12 is guided by the guide portions 19b on the mount surface portion 19a of the upper plate 19 and mounted to the predetermined position thereof. Then, the respective solder portions 12b of the IC package 12 are inserted into the paired contact portions 16e and 16f now opened with the no-contacting state.

Figure 22C:
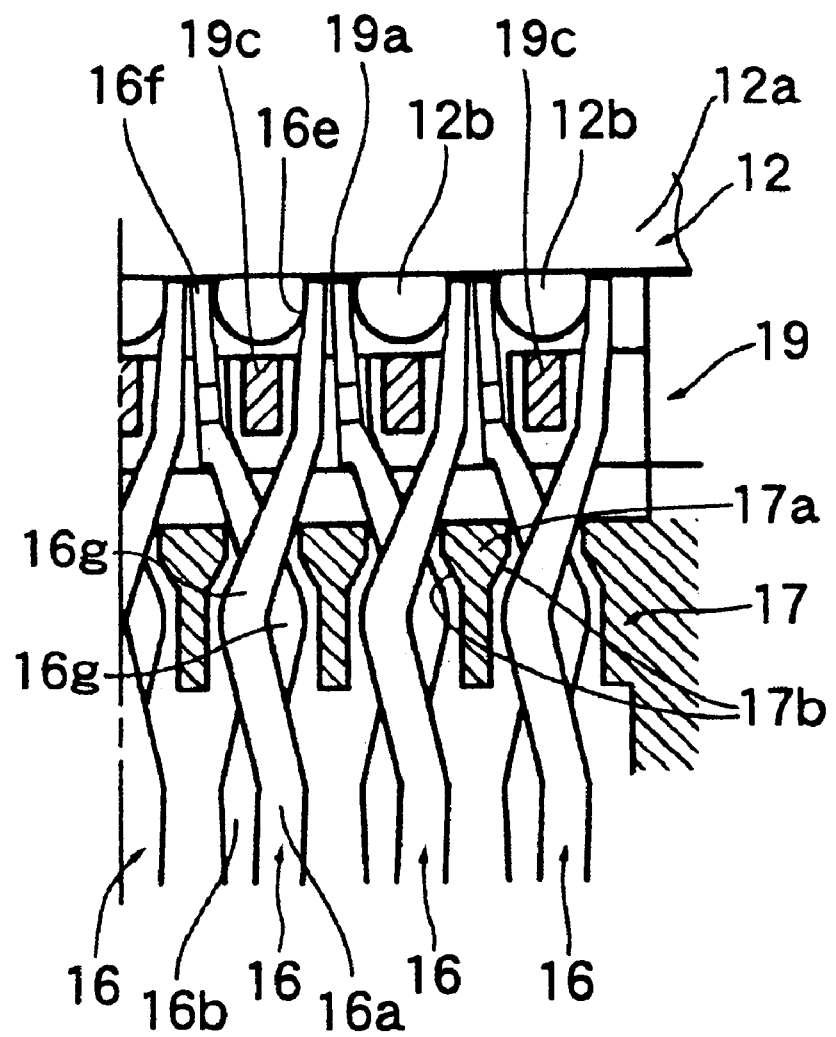
FIG. 22C shows a state that the solder ball is held between the paired contact portions of the contact pin.
Figure 23:
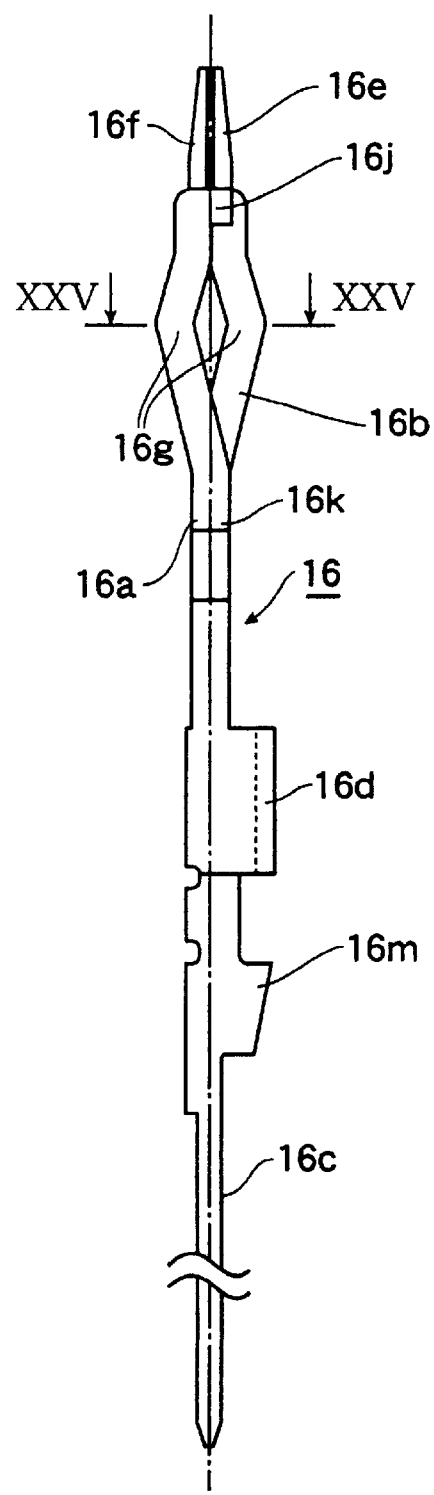
FIG. 23 is a front view of a contact pin according to an eighth embodiment of the present invention.
Figure 24:
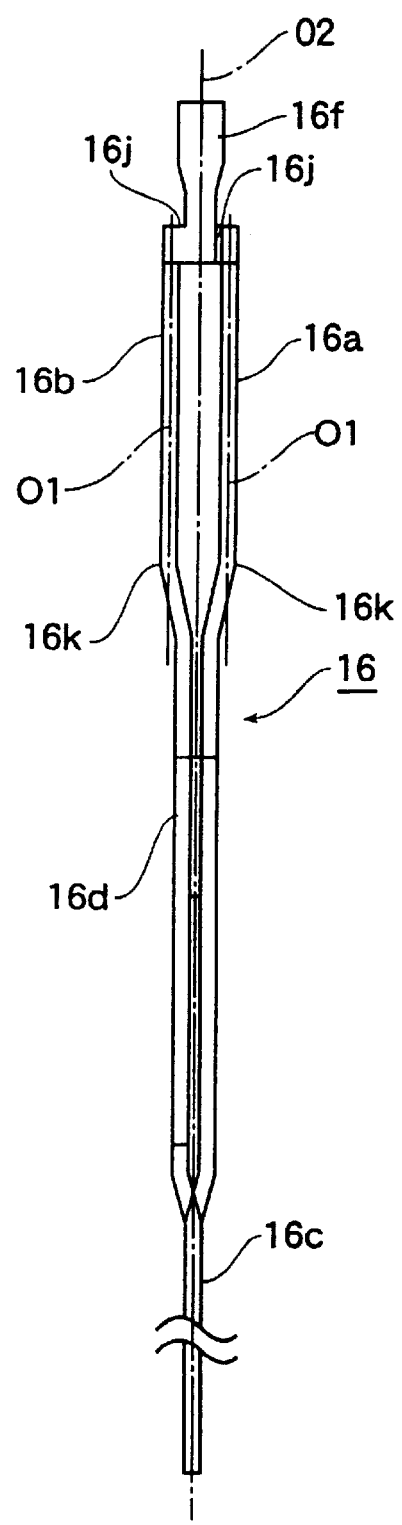
FIG. 24 is a left side view of FIG. 23.
Figure 25:
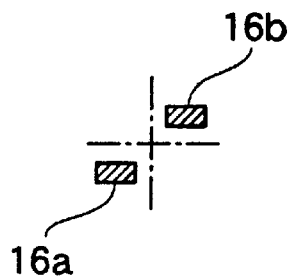
FIG. 25 is a sectional view taken along the line XXV—XXV of FIG. 23.
Figure 26:
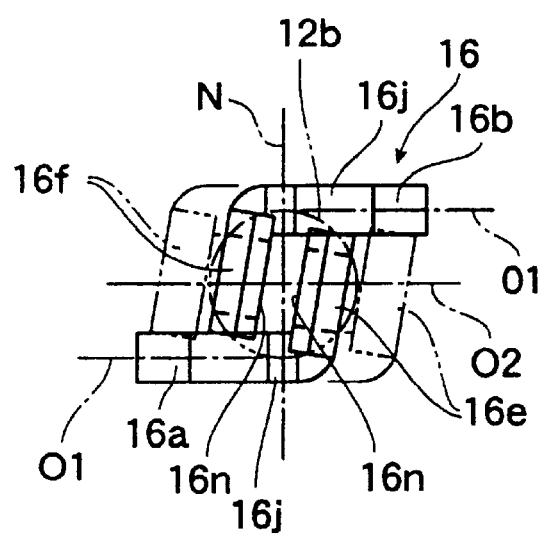
FIG. 26 is a plan view of FIG. 23.

Thereafter, when the downward pressing force to the operation member 21 is released and the movable plate 17 is moved upward, the pressing force of the cam portions 17a to the bent portions 16g of the contact pin 16 is also released, and then, the paired contact portions 16e and 16f are moved in the closing direction thereof so as to clamp the solder ball 12b therebetween as shown in FIG. 22C.

At this operation, since the axis O1 passing the root portion 16k of one elastic piece 16b and the axis O2 passing the contact portion 16f are offset from each other, when the contact portion 16f abuts against the solder ball 12b, the wiping effect is caused by a slight sliding motion thereof thereby to achieve an improved electrical contact stability.

Figure 21:
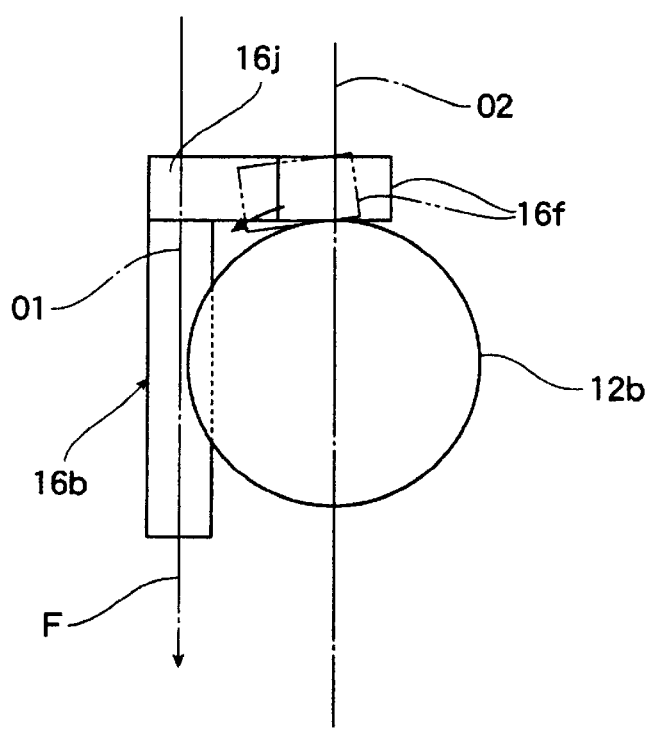
FIG. 21 is a plan view, according to the seventh embodiment, showing a state of the solder ball and an elastic piece of the contact pin viewed from the upper side thereof.

That is, one contact portion 16f is returned by the elastic force of one elastic piece 16b from the state of the elastic piece 16b being opened and abuts against the solder ball 12b as shown with a solid line in FIG. 21, and this one elastic piece 16b is further returned to the original position. In this operation, since the axis O1 passing the root portion 16k of one elastic piece 16b and the axis O2 passing the contact portion 16f are offset from each other, the returning force F due to the elastic piece acts on the position offset with respect to the contacting point of the contact portion 16f. As a result, the contact portion 16f is shifted in an arrowed direction shown with two dots and chain line in FIG. 21 and slides on the side surface of the solder ball 12b, thus achieving the wiping effect. Accordingly, as mentioned above, the improved wiping effect can be achieved by making the simple change of the contact pin 16, and hence, the improved contact stability can be also realized.

The other structures of this embodiment are substantially the same as those mentioned with reference to the first embodiment, so that the details thereof are omitted herein.

[Eighth Embodiment]

FIGS. 23 to 26 represent eighth embodiment of the present invention, in which both the elastic pieces 16a and 16b of the contact pin 16 have symmetrical shape and a pair of contact portions 16e and 16f are formed to the upper sides of the bent portions 15g through crank portions 15j, respectively. According to the location of these crank portions 16j, the axis passing root portions 16k of both the elastic pieces 16a and 16f and the axis passing both the contact portions 16e and 16f are offset from each other.

The contact portions 16e and 16f have flat contact surfaces 16n to which the solder ball 12b contacts, and these flat contact surfaces 16n have predetermined angles with respect to the direction N normal to the contacting or separating direction of the solder ball 12b (7°±2° in this embodiment). The solder ball 12b is held by these flat contact surfaces 16n as shown with two dots and chain line in FIG. 26.

According to the structure of this embodiment mentioned above, since the axis O1 passing the root portions 15k of both the elastic pieces 16a and 16b and the axis O2 passing the contact portions 16e and 16f are offset from each other, an improved wiping effect can be achieved as in the former embodiments. In addition, since the flat contact surfaces 16n have predetermined angles with respect to the direction N normal to the contacting or separating direction of the solder ball 12b (7°±2° in this embodiment), the wiping effect can be further improved.

The structures other than the above are substantially the same as those mentioned hereinbefore with reference to the former seventh embodiment, and the details thereof are hence omitted herein.

[Ninth Embodiment]

Figure 27:
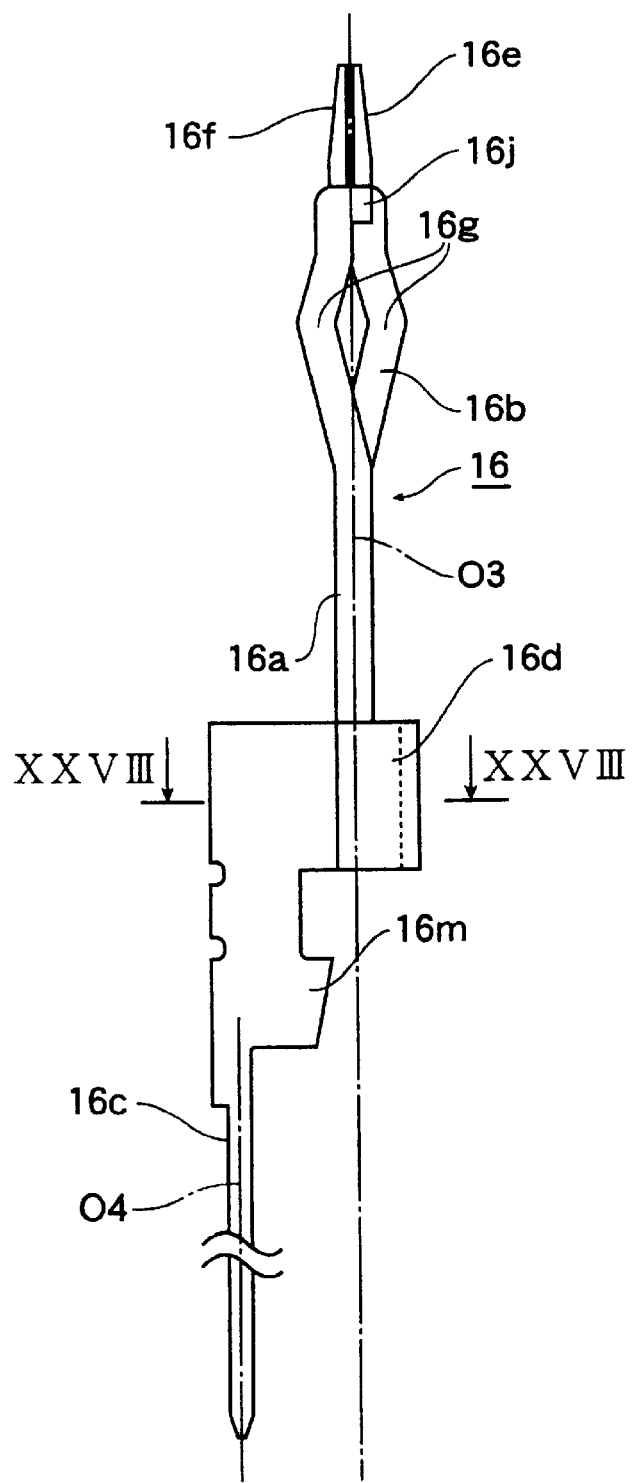
FIG. 27 is a front view of a contact pin according to a ninth embodiment of the present invention.
Figure 28:
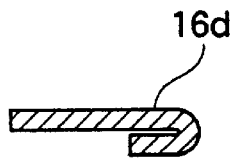
FIG. 28 is a sectional view taken along the line XXVIII—XXVIII of FIG. 27.
Figure 29:
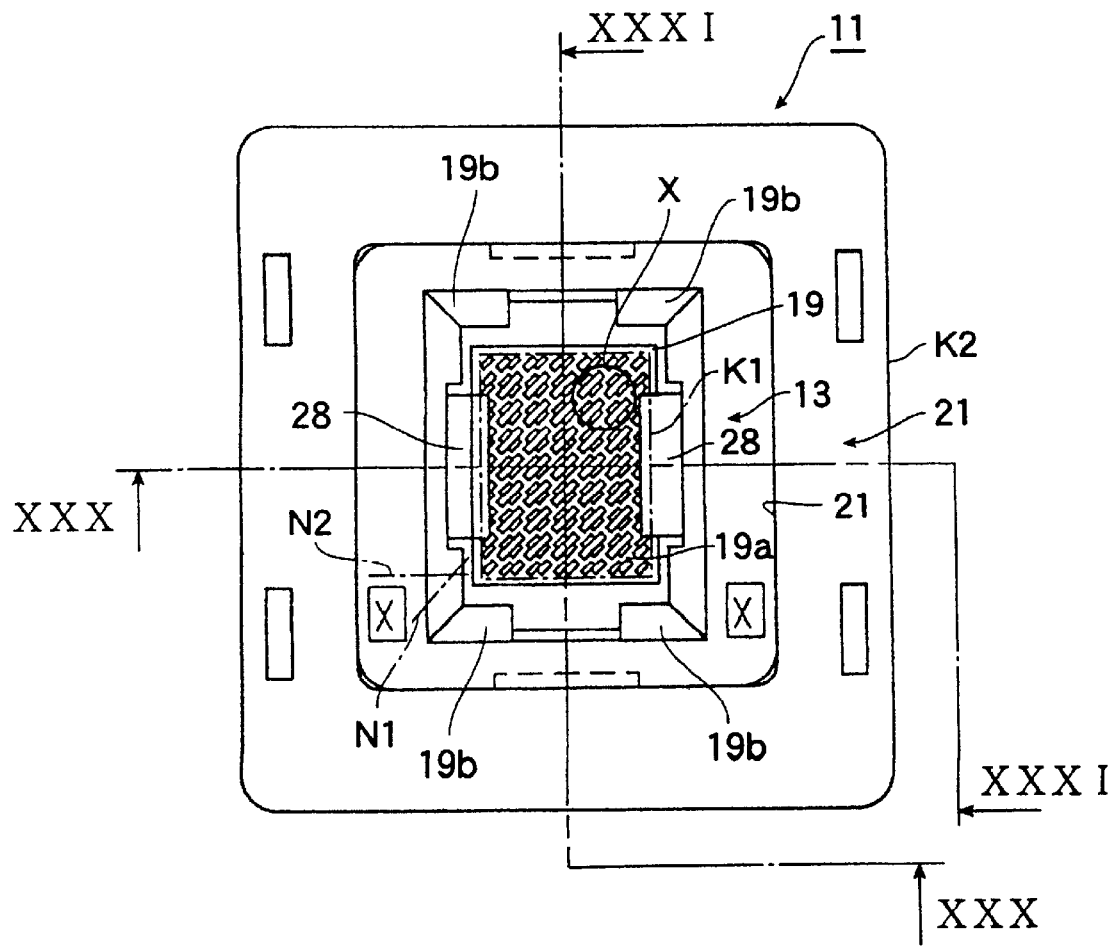
FIG. 29 is a plan view of an IC socket according to a tenth embodiment of the present invention.

FIGS. 27 and 28 represent the ninth embodiment of the present invention, in which the contact pin 16 has a base portion 16d different in shape from that of the seventh embodiment such that one portion of the U-shaped base portion 16d has a length longer than that of the other one portion as shown in FIG. 28. According to this structure, the center line O3 of both the elastic pieces 16a and 16b and the center line O4 of the solder tail portion 16c are offset from each other.

According to this structure, it is not necessary to locate the through holes of the printed circuit board, not shown, directly below the corresponding solder balls 12b, respectively, and the positional relationship between the corresponding solder ball 12b and the through hole can be offset by optionally setting the offset amount therebetween.

The structures other than the above are substantially the same as those mentioned above with reference to the former eighth embodiment, and the details thereof are hence omitted herein.

[Tenth Embodiment]

FIGS. 29 to 34 represent the tenth embodiment of the present invention, in which the contact portions 16e and 16f of the contact pin 16 have displacing directions different from those of the former first and seventh embodiments. The contact pin 16, as a single piece, has the same structure as that of the seventh embodiment, and the functions of the socket body 12, the movable plate 17, the upper plate 19, the operation member 21, the latch 28 etc. are substantially identical to those of the first embodiment though the shapes thereof are somewhat different.

That is, as shown in FIGS. 29 to 34, such contact pins 16 are arranged in matrix having vertical and horizontal rows, and respective sides of a rectangular outer edge portion K1 of the matrix arrangement and those of a rectangular outer shape K2 of the IC socket 11 are made substantially parallel to each other in a plan view, i.e. in a state of using the IC socket 11.

The displaced direction N1 of the paired contact portions 16e and 16f of the respective contact pins 16 has predetermined angles, 45° in this embodiment, with respect to the arrangement direction N2 of the vertical rows or horizontal rows of the contact pins 16.

In this tenth embodiment of the structure mentioned above, when it is required to set the IC package 12 to the IC socket 11, the operation member 21 is first depressed downward. Then, the arms 23 are rotated in a counterclockwise direction by the cam surface 21a of the operation member 21 from the state shown in FIG. 31A to the state shown in FIG. 31B thereby to lower the movable plate 17. According to the lowering of the movable plate 17, the cam portions 17a thereof are also lowered from the state shown in FIGS. 32 and 34A to the state shown in FIGS. 33 and 34B. Then, both the bent portions 16g of the contact pins 16 are pressed by the sliding surfaces 17b of the cam portions 17a, thus opening the paired contact portions 16e and 16f as shown in FIG. 33.

Figure 30:
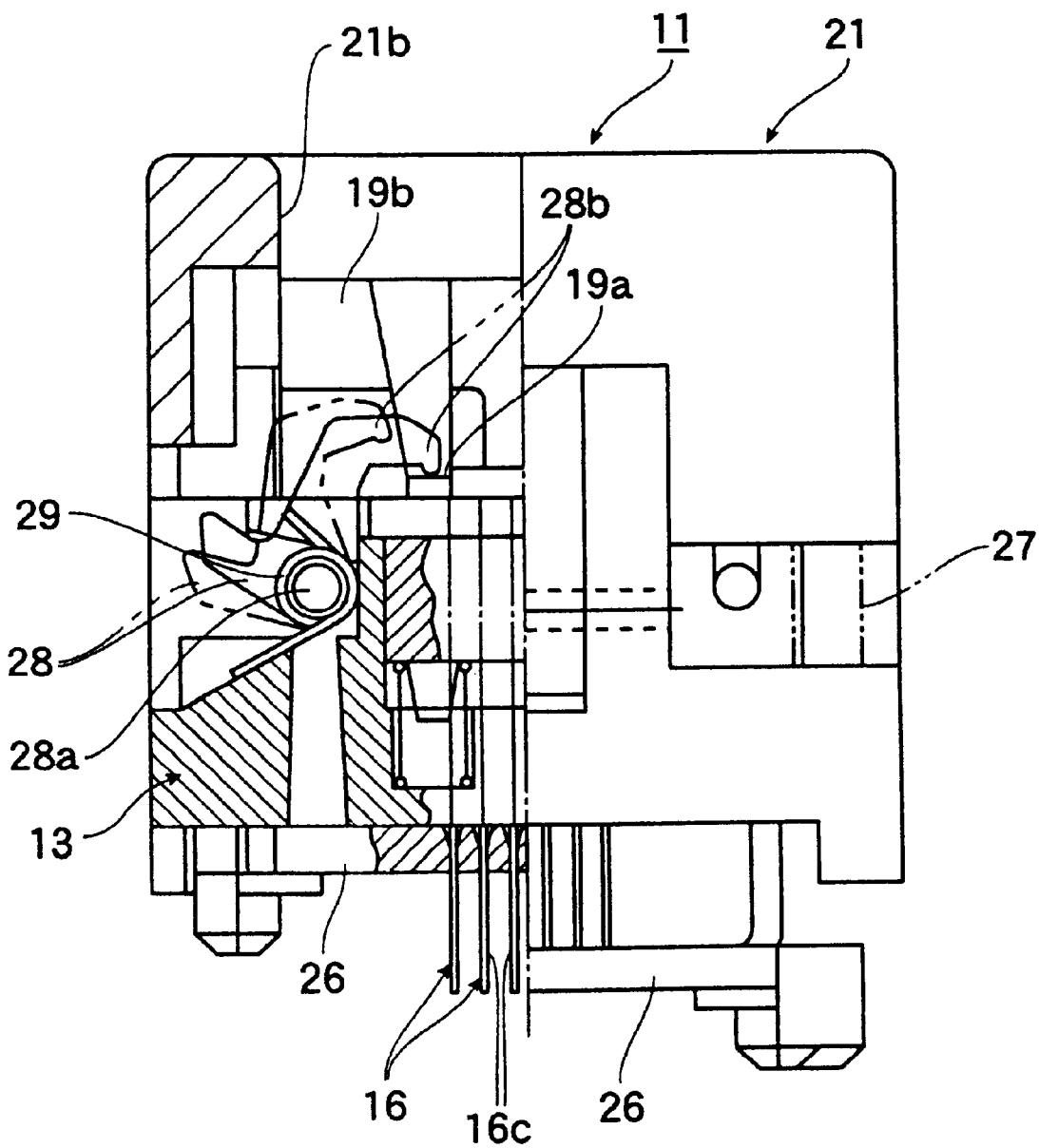
FIG. 30 is a sectional view taken along the line XXX—XXX of FIG. 29.
Figure 31A:
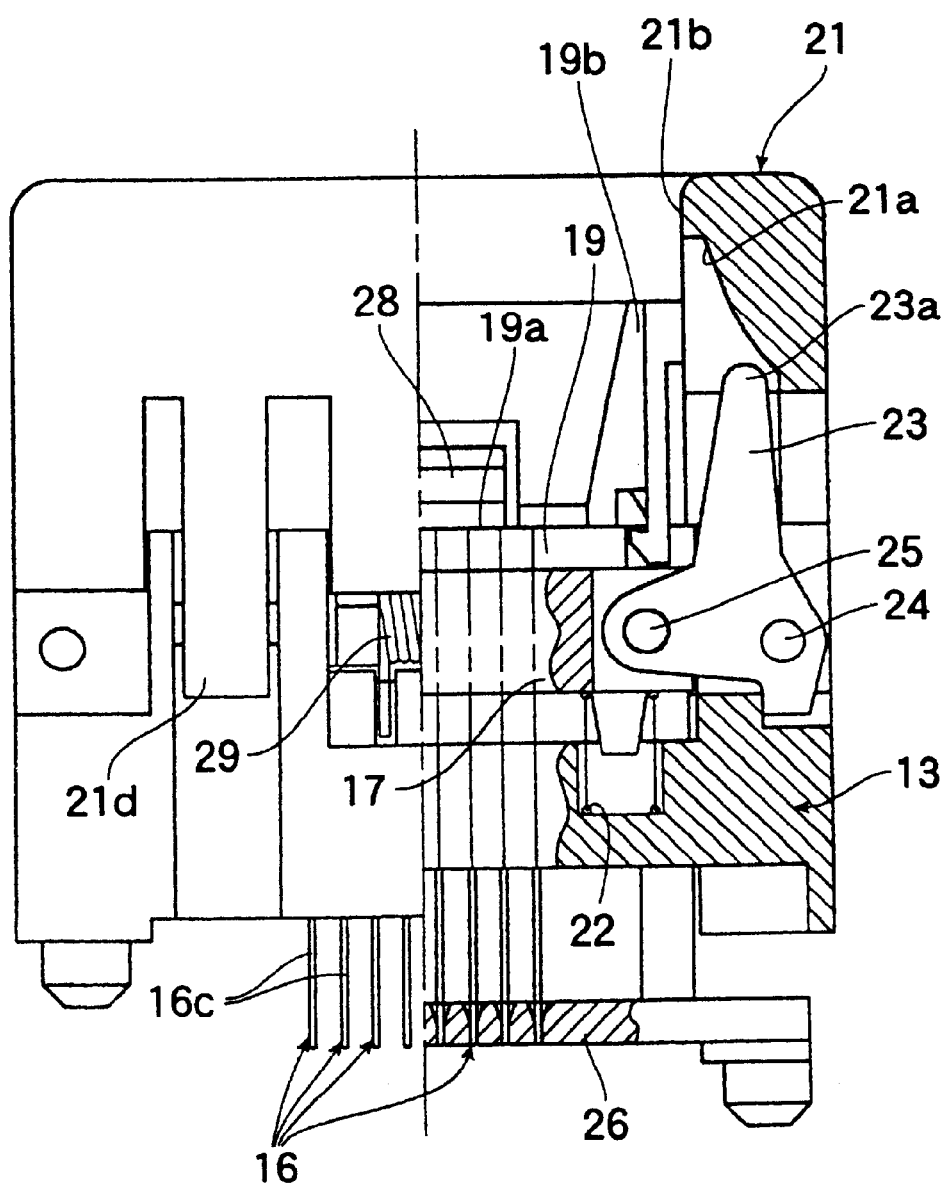
FIG. 31 is a sectional view taken along the line XXXI—XXXI of FIG. 29.
Figure 31B:
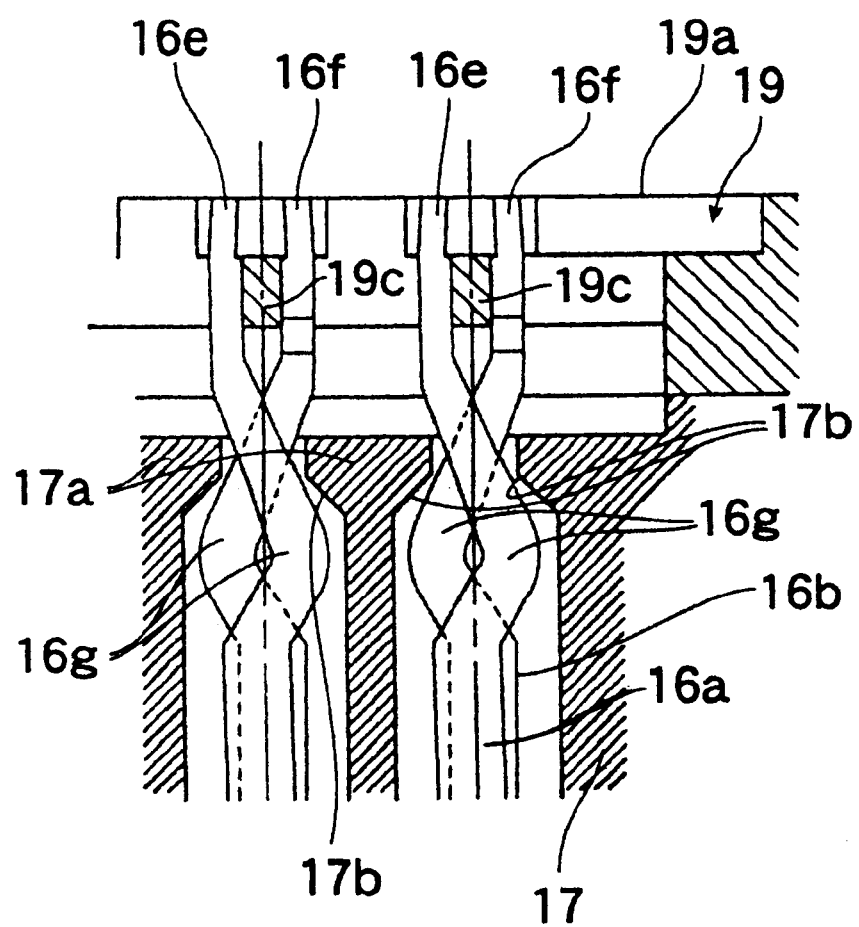
Figure 32A:
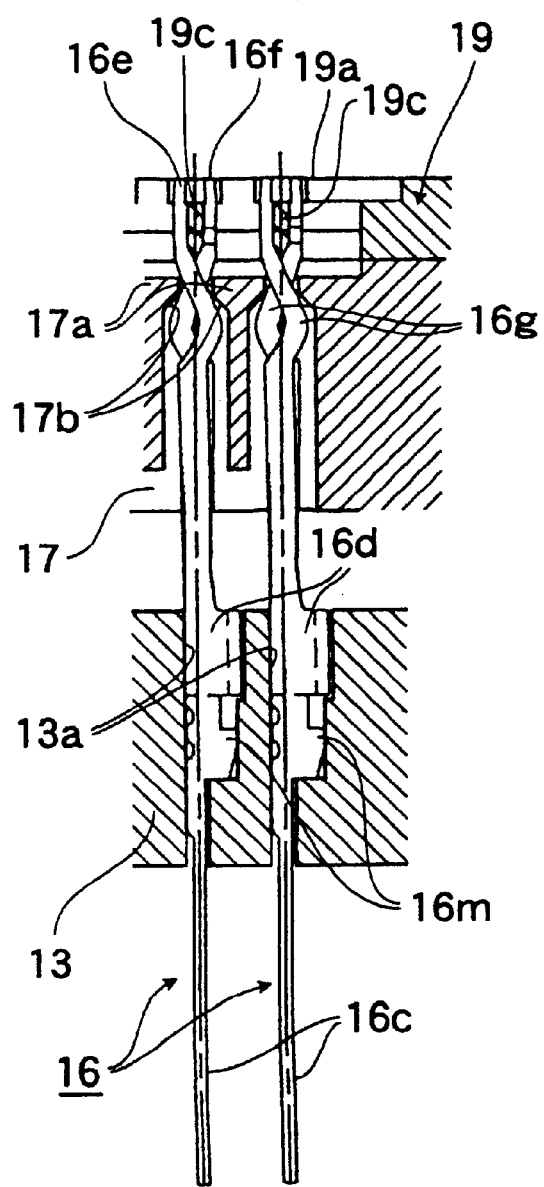
FIG. 32A is a sectional view showing contact pin arrangement and FIG. 32B is a view showing an essential portion of FIG. 32A in an enlarged scale.
Figure 32B:
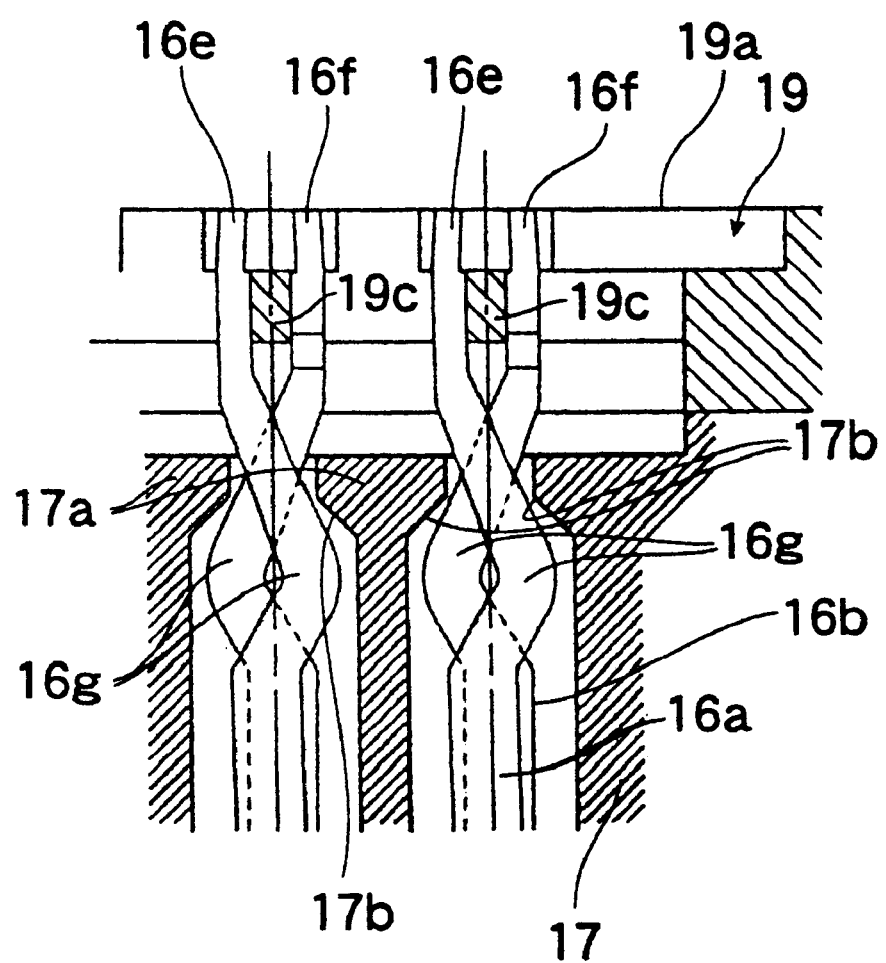

At the same time, according to the operation of the operating portion of the operation member 21, the depressed portion of the latch 28 is pressed and rotated in the clockwise direction against the urging force of the spring 19 from the state shown with the solid line in FIG. 30 to the state shown with the two dots and chain line in FIG. 30, and the pressing portion 28b of the latch 28 is displaced to its retired position.

Figure 33A:
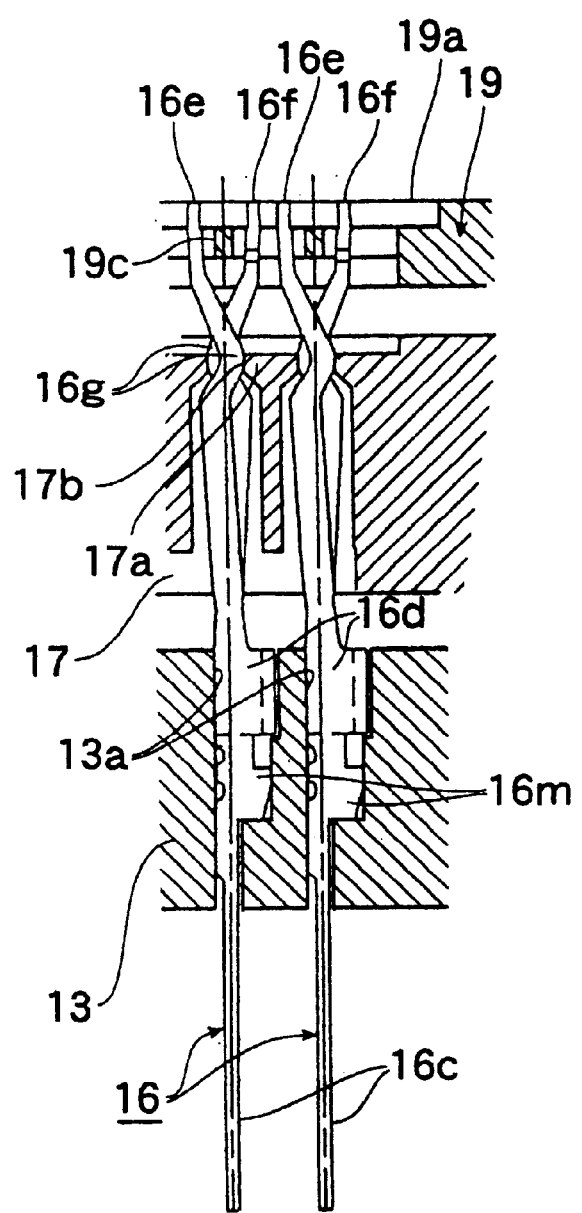
FIG. 33A is a sectional view showing contact pin arrangement and FIG. 33B is a view showing an essential portion of FIG. 33A in an enlarged scale.
Figure 33B:
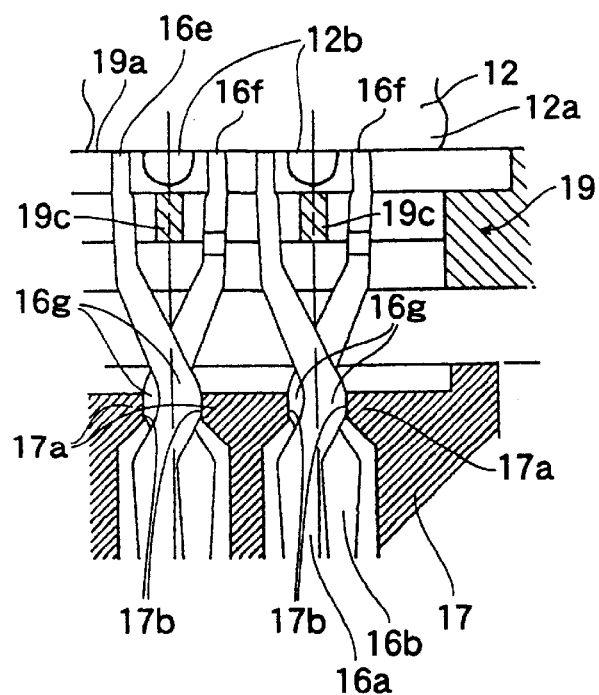
Figure 34A:
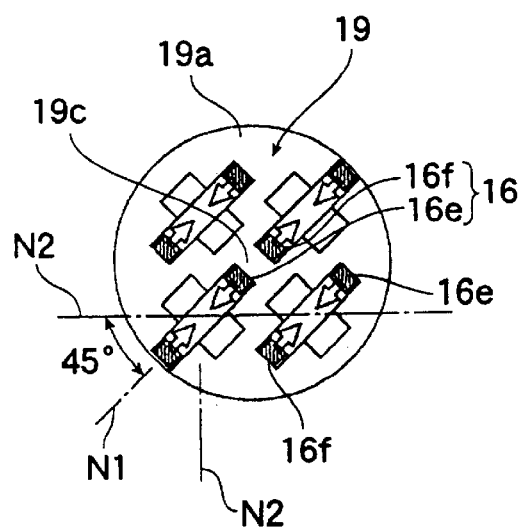
FIG. 34A shows a closed state of the contact portions of the contact pin and FIG. 34B shows an opened state of the contact portions of the contact pin.
Figure 34B:
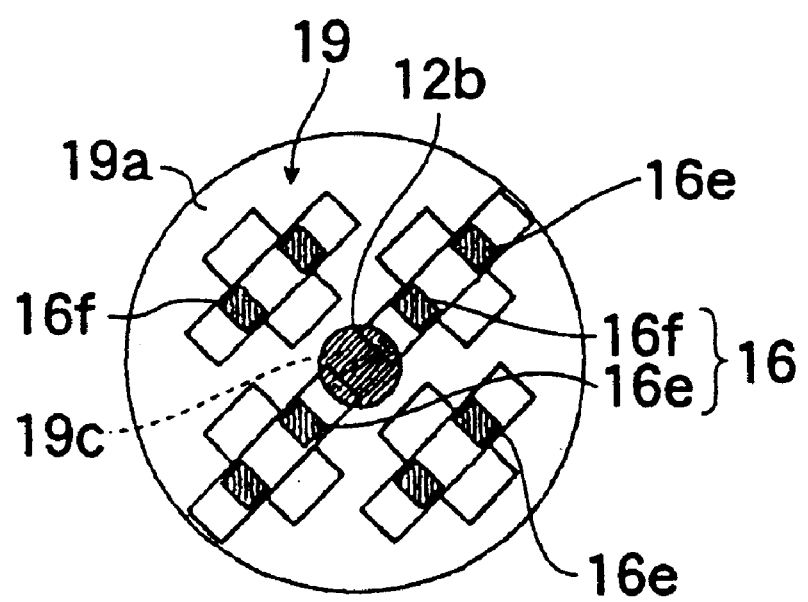
Figure 35A:
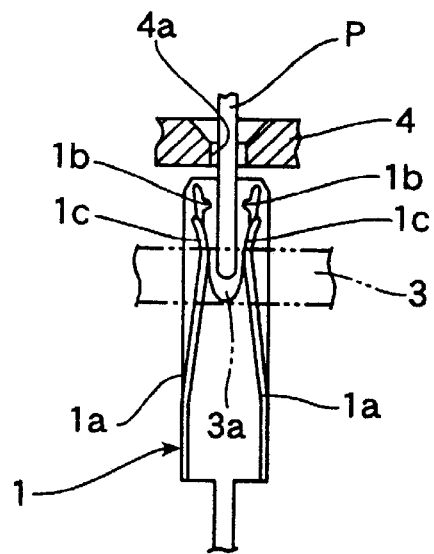
FIG. 35A shows an opened state of contact portions of a contact pin and FIG. 35B shows a sectional view showing a connection pin clamped by the contact portions of the contact pin.
Figure 35B:
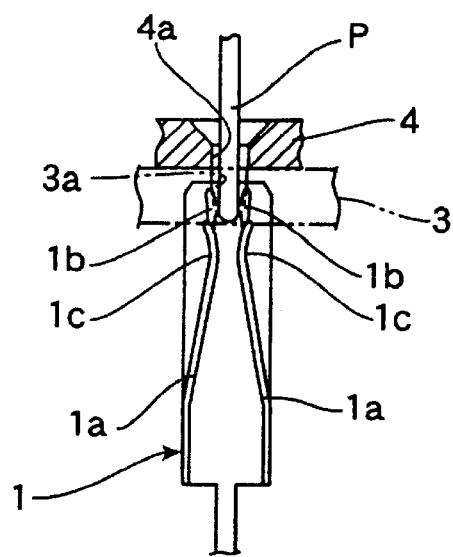

Under the state mentioned above, the IC package 12 is guided by the guide portions 19b and then mounted to the predetermined position on the mount surface portion 19a of the upper plate 19, and the respective solder balls 12b of the IC package 12 are inserted into the space between the opened contact portions 16e and 16f of the respective contact pins 16 with no-contacting state as shown in FIG. 33B.

Thereafter, the releasing of the downward pressing force to the operation member 21 allows the operation member 21 to be moved upward by the urging force of the spring 27 or the like, the movable plate 17 is also moved upward, and the latch 28 is then rotated in the clockwise direction in FIG. 33 by the urging force of the spring 29.

When the movable plate 17 is moved upward, the pressing force of the cam portions 17a to the bent portions 16g of the contact pins 16 is released, and the bent portions 16g are then moved in the closing direction thereby to clamp the solder balls 12b therebetween. In thus manner, the electrical connection between the solder balls 12b of the IC package 12 and the printed circuit board can be established through the contact pins 16.

In this structure, as shown in FIGS. 29 to 34, the respective sides of the rectangular outer edge portion K1 of the matrix arrangement and those of the rectangular outer shape K2 of the IC socket 11 are made substantially parallel to each other in a plan view, i.e. in a state of using the IC socket 11. The displaced direction N1 of the paired contact portions 16e and 16f of the respective contact pins 16 has predetermined angles, 45° in this embodiment, with respect to the arrangement direction N2 of the vertical rows or horizontal rows of the contact pins 16. Accordingly, the shifting amount of the contact portion 16f of the contact pin 16 can be ensured, and moreover, the IC socket 11 can be made itself compact.

Furthermore, according to the structure of the present invention, since the solder balls 12b of the IC package 12 are clamped by displacing each other the contact portions 16e and 16f formed to the paired elastic pieces 16a and 16b of the contact pins 16, the moving amount of the movable plate 17 displacing the contact portions 16e and 16f can be made small because the displacing amount of the respective contact portions 16e and 16f can be made small in comparison with the structure in which one of the contact portions is displaced. In this regard, the IC socket 11 can be also made compact in addition to the advantageous effects mentioned above.

Still furthermore, In this embodiment, since the contact portions 16e and 16f of the contact pin 16 can be displaced by the vertical movement of the movable plate 17, and accordingly, in comparison with the case that the contact portions are displaced by horizontally sliding the movable plate, the IC socket can be made further compact in addition to the advantageous effects mentioned above.

It is to be noted that the present invention is not limited to the described embodiments and many other changes and modifications may be made without departing from the scopes of the appended claims.

For example, in the above-mentioned embodiments, although the present invention is applied to the IC socket as a socket for electrical parts, the present invention is not limited to such IC socket and is applicable to other devices. Furthermore, although the present invention is applied to the IC socket for the BGA type IC package 12, the present invention is not limited to such IC socket and is applicable to the IC socket for a PGA (Pin Grid Array) type IC package. Still furthermore, a pair of elastic pieces 16a and 16b are formed to the contact pins 16 of the seventh to tenth embodiments, a modified example, in which only one elastic piece is formed to the contact pin, may be adopted.

What is claimed is:

1. A socket for an electrical part comprising:
    a socket body having a mount portion on which an electrical part having terminals is mounted;
    a number of contact pins to be contacted to or separated from the terminals of the electrical part; and
    a movable plate disposed to the socket body to be movable perpendicularly with respect to the mount portion of the socket,
    wherein each of said contact pins has a pair of elastic pieces formed, at front end portions thereof, with contact portions which are opened or closed in accordance with the movement of said movable plate thereby to establish an electrical connection between the contact portions and the terminals of the electrical part when the contact portions are closed, said paired elastic pieces having a first piece and a second piece, said first piece being provided with a first projection portion and said second piece being provided with a second projection portion, said first projection portion projecting toward said second piece, said second projection portion projecting said first piece, said movable plate is provided with cam portions arranged between adjacent contact pins, respectively, and when the movable plate is moved, said cam portions which are disposed on both sides of the pair of the elastic pieces pressing the projection portions of the paired elastic pieces to be close to each other thereby opening the contact portions.

2. A socket for an electrical part according to claim 1, wherein said paired elastic pieces are bent to form the projection portions thereon so that said elastic pieces cross each other.

3. A socket for an electrical part according to claim 1, wherein the elastic pieces of both the adjacent contact pins are pressed by one cam portion of the movable plate disposed between the elastic pieces of the adjacent contact pins.

4. A socket for an electrical part according to claim 1, wherein said paired elastic pieces of the contact pin has a common base portion and the elastic pieces are opposed to each other by bending the base portion.

5. A socket for an electrical part according to claim 1, wherein said contact pin is provided with a solder tail portion extending from the base portion of the elastic pieces in a direction opposing to the elastic pieces, said solder tail portion is formed with a bent portion near the base portion of the elastic pieces so that a center line of the paired elastic pieces accords with a center line of the solder tail portion.

6. A socket for an electrical part according to claim 1, wherein said contact pins are arranged in matrix shape in a manner that the paired contact portions of the respective contact pins have displaced direction having predetermined angles with respect to an arrangement direction of the contact pins.

7. A socket for an electrical part according to claim 6, wherein said predetermined angles are 45°.

8. A socket for an electrical part according to claim 1, wherein each of said terminals of the electrical part has a spherical outer shape and said paired contact portions of the contact pin are positioned on a diametral line of the spherical terminal on both sides thereof.

9. a socket for an electrical part according to claim 8, wherein said spherical terminal is a solder ball.

10. A socket for an electrical part according to claim 1, wherein each of said terminal of the electrical part has a spherical outer shape and said paired contact portions of the contact pin are displaced and have surfaces contacting the terminal, said contacting surfaces being inclined with respect to a displaced direction of the contact portions.

11. A socket for an electrical part according to claim 10, wherein said spherical terminal is a solder ball.

12. A socket for an electrical part according to claim 1, wherein an axis passing a root portion of at least one of the elastic pieces and an axis passing the contact portion thereof are offset from each other so that said contact portions slide on a surface of the terminal after contacting thereto by an elastic force of the elastic pieces.

13. A socket for an electrical part comprising:
    a socket body having a mount portion on which an electrical part having terminals is mounted; and a number of contact pins to be contacted to or separated from the terminals of the electrical part, wherein each of said contact pins has an elastic piece having, at a front end portion thereof, with a contact portion which is contacted to or separated from each of the terminals of the electrical part and wherein an axis passing a root portion of the elastic piece and an axis passing the contact portion are offset from each other to a direction orthogonal to a contact direction of the elastic piece so that said contact portion slides on a surface of the terminal after contacting thereto by an elastic force of the elastic piece.

14. A socket for an electrical part according to claim 13, wherein said contact portion of the contact pin has a flat contact surface contacting to the terminal, said flat contact surface has predetermined angles with respect to a direction normal to a contacting or separating direction of the contact portion.

15. A socket for an electrical part comprising:

a socket body having a mount portion on which an electrical part having terminals is mounted; and a number of contact pins to be contacted to or separated from the terminals of the electrical part, wherein each of said contact pins has a pair of elastic pieces having, at front end portions thereof, with contact portions which are contacted to or separated from each of the terminals of the electrical part and wherein an axis passing a root portion of at least one of the elastic pieces and an axis passing the contact portion thereof are offset from each other to a direction orthogonal to a contact direction of at least one of the elastic pieces so that said contact portions slide on surfaces of the terminals after contacting thereto by elastic forces of the at least one of the elastic pieces.

16. A socket for an electrical part according to claim 15, wherein each of said contact portions of the contact pin has a flat contact surface contacting to the terminal, said flat contact surface has predetermined angles with respect to a direction normal to a contacting or separating direction of the contact portion.

17. A socket for an electrical part comprising:

a socket body having a mount portion on which an electrical part having terminals is mounted;

a number of contact pins to be contacted to or separated from the terminals of the electrical part: and a movable plate disposed to the socket body to be movable perpendicularly with respect to the mount portion of the socket, wherein each of said contact pins has a pair of elastic pieces formed, at front end portions thereof, with contact portions which are opened or closed in accordance with the movement of said movable plate thereby to establish an electrical connection between the contact portions and the terminals of the electrical part when the contact portions are closed, said movable plate is provided with cam portions arranged between adjacent contact pins, respectively, and when the movable plate is moved, said elastic pieces are pressed by a pair of cam portions disposed on both the sides of each of the contact pins thereby to open the contact portions, and wherein an axis passing a root portion of at least one of the elastic pieces and an axis passing the contact portion thereof are offset from each other to a direction orthogonal to a contact direction of at least one of the elastic pieces so that said contact portions slide on a surface of the terminal after contacting thereto by an elastic force of the at least one of the elastic pieces.

18. A socket for an electrical part comprising:

a socket body having a mount portion on which an electrical part having terminals is mounted; and a number of contact pins to be contacted to or separated from the terminals of the electrical part, wherein said contact pins are arranged in shape of matrix having vertical and horizontal rows, the matrix arrangement having a rectangular outer edge portion and said socket body for an electrical part having a rectangular outer shape in a plan view in a usable state, respective side portions of the rectangular outer edge portion of the matrix arrangement and respective side portions of the rectangular outer shape of the socket body are substantially parallel to each other, and wherein each of said contact pin is formed with an elastic piece having, at a front end portion thereof, a contact portion contacting to or separating from the terminal of the electrical part and said contact portions of the elastic pieces of the respective contact pins have a displaced direction which has predetermined angles with respect to the arrangement direction of the vertical and horizontal rows of the contact pins in the matrix arrangement thereof.

19. A socket for an electrical part according to claim 18, wherein a pair of elastic pieces are formed to each of the contact pins and said elastic pieces having, at front end portions thereof, a pair of contact portions between which the terminal of the electrical part is clamped to establish electrical connection therebetween.

20. A socket for an electrical part according to claim 18, wherein said predetermined angles are 45°.

21. A socket for an electrical part according to claim 18, further comprising a movable plate disposed to the socket body to be movable perpendicularly with respect to the mount portion of the socket, said movable plate being provided with a cam portion, wherein said elastic piece is formed at a front end portion thereof with a contact portion which is displaced by pressing the elastic piece by the cam portion of the movable plate when the movable plate is moved perpendicularly.

22. A socket for an electrical part according to claim 13, wherein said terminal has a substantially spherical shape, and each of said contact pins has a pair of elastic pieces each of which has the contact portion, and wherein said contact portions of the paired elastic pieces are arranged on a line extending from a diameter of the spherical shaped terminal.

* * * * *